(12) United States Patent
Ullrich et al.

(10) Patent No.: US 7,923,758 B1
(45) Date of Patent: Apr. 12, 2011

(54) METHOD AND APPARATUS FOR PRODUCING GALLIUM ARSENIDE AND SILICON COMPOSITES AND DEVICES INCORPORATING SAME

(75) Inventors: Bruno Ullrich, Bowling Green, OH (US); Artur Erlacher, Bowling Green, OH (US)

(73) Assignee: Bowling Green State University, Bowling Green, OH (US)

( * ) Notice: Subject to any disclaimer, the term of this patent is extended or adjusted under 35 U.S.C. 154(b) by 412 days.

(21) Appl. No.: 11/973,680

(22) Filed: Oct. 10, 2007

Related U.S. Application Data

(62) Division of application No. 10/773,886, filed on Feb. 6, 2004, now abandoned.

(51) Int. Cl.
*H01L 31/062* (2006.01)
(52) U.S. Cl. .................. 257/233; 257/292; 257/E31.105
(58) Field of Classification Search .................. 257/292, 257/233, 288, E31.105
See application file for complete search history.

(56) References Cited

U.S. PATENT DOCUMENTS 6,211,560 B1 * 4/2001 Jimenez et al. ............... 257/451
* cited by examiner

*Primary Examiner* — Thanhha Pham
(74) *Attorney, Agent, or Firm* — Roger A. Gilcrest

(57) ABSTRACT

The present invention includes methods for producing GaAs/Si composites, GaAs/Si composites, apparatus for preparing GaAs/Si composites, and a variety of electronic and photoelectric circuits and devices incorporating GaAs/Si composites of the present invention.

8 Claims, 25 Drawing Sheets

ISOMETRIC VIEW

Figure 9: Image of the p-GaAs/n-Si sample including schematically the circuit used for the photocurrent measurements. For the optical excitation, the sample was illuminated between the Al contacts.

Figure 10: X-ray diffraction patterns for both samples. The background signal of the substrate has been subtracted.

Figure 11: AFM image of the surfaces of the p-GaAs/n-Si sample (units in nm). The GaAs surface is rather smooth and flat containing several peaks and craters, which are most likely caused by the impact of high-energy particles or heavy clusters.

Figure 12: Three dimensional and top AFM image of the surface of the n-GaAs/p-Si sample (units in μm). The film is fairly smooth and looks similar to the surface image shown in Fig.11.

Figure 13: I/V characteristic of the p-GaAs/n-Si and n-GaAs/p-Si sample.

Figure 15: The realization of a hybrid multiplexer by switching the responsivity of the p-GaAs/n-Si hetero-junction between the Si substrate and the thin-film GaAs. The separation of the peaks is 126 nm.

Figure 17: (a) Image of a p-GaAs/n-Si sample and (b) the schematic sketch of the circuit used to measure the PC.

Figures 18(a) and 18(b): (a) PC of the sample formed at 355 nm and (b) PC of the sample formed at 532 nm for various forward (+) and reverse biases.

PC of the sample formed at 1064 nm.

Figure 20(a) and 20(b): I/V characteristic in the dark of the sample formed (a) at 355 nm and (b) at 532 nm.

Figure 21: I/V characteristic in the dark of the sample formed at 1064 nm.

Figures 22(a) and 22(b): X-ray patterns of the sample formed at (a) 355 nm and (b) 532 nm.

Figure 23: X-ray signal of the film formed at 1064 nm and of a Si substrate without film.

METHOD AND APPARATUS FOR PRODUCING GALLIUM ARSENIDE AND SILICON COMPOSITES AND DEVICES INCORPORATING SAME

RELATED APPLICATION DATA

This application is a divisional of U.S. application Ser. No. 10/773,886 filed Feb. 6, 2004 now abandoned, which is incorporated herein by reference.

BACKGROUND OF THE INVENTION

The present invention relates to a method and apparatus for producing layered composites of gallium arsenide and silicon, layered articles produced there by and devices produced therefrom.

The III-V compound semiconductor GaAs has a rapidly growing impact on electronic circuits and optoelectronic devices. Thus the control preparation of GaAs films of appreciable technological interest. In general, in order to achieve high-quality epitaxial growth, GaAs films or grown as GaAs wafers, which are rather expensive. On the other in the most important achieve semiconductor silicon is nonstandard substrate for high-quality of gallium arsenide preparations. The GaAs devices prepared on silicon substrates, however, would be considered to increase the flexibility of optoelectronic device structures.

The ability to efficiently effectively layer gallium arsenide on silicon has been the subject of substantial research over the past several decades in light of the wide variety of electrical devices that can be produced from the chemically and physically uniform combination of the materials.

One of the difficulties in combining these two materials is that it has been difficult to layer them together so as to achieve a stoichiometric combination of the two species. This is naturally important to provide reliable and consistent electrical or photoelectrical function in devices made from this combination. This is also important to the ability of such processes to be scaled for production of large amounts of these composites of reproducible quality.

Beyond the challenge of uniform and stoichiometric combination, it is also desirable to be able to create layered composite materials whose smoothness is on the order of nanometers in scale. This is particularly important to the production of electronic circuits and devices that would benefit from these composites, such as rectifiers, as well as photoelectric devices, such as sensors and optoelectronic mutliplexers.

For instance, the combination of the excellent high-frequency electrical properties of the III-V compound semiconductor GaAs with the sophisticated technology of Si has been very attractive for the semiconductor industry since a long time.[4] GaAs offers high carrier mobility and fast optoelectronic properties, which are needed for high-frequency devices and laser applications. In order to take full advantage of the GaAs properties an almost perfect crystal structure and very low impurity concentration are required. These top-quality demands increase the price of GaAs devices clearly beyond the cost of Si based devices. The speed of GaAs linked with the meanwhile perfect and rather inexpensive production of Si seems the perfect optoelectronic merge from the technology and economic point of views. In the last few years, several research groups have reported epitaxial growth of thin-film GaAs on Si wafers.[14,15] The most frequently applied method to form thin-film GaAs on Si is molecular beam epitaxy (MBE). However, it seems that MBE is eventually not the superior method to conquer the problems of large lattice mismatch (4.1%) and thermal expansion coefficient (2.5 times) between GaAs and Si.[1] In this paper, we introduce pulsed-laser deposition (PLD) as a cost-effective alternative method to achieve high-quality GaAs films on Si. We demonstrate that the PLD of GaAs on counter-doped Si forms a functional pn-junction. The device shows novel and appealing features, which are applicable to telecommunication purposes.

Accordingly, the present invention allows one to achieve GaAs/Si composites, such as GaAs films on Si, which are in substantially stoichiometric combination.

The present invention further permits one to prepare layered GaAs/Si composites, such as GaAs films on a Si layer, that are able to reach levels of smoothness on nanometer scale.

In addition to the features mentioned above, objects and advantages of the present invention will be readily apparent upon a reading of the following description and through practice of the present invention.

SUMMARY OF THE INVENTION

In general terms, the present invention includes methods for producing GaAs/Si composites, GaAs/Si composites, apparatus for preparing GaAs/Si composites, and a variety of electronic and photoelectric circuits and devices incorporating GaAs/Si composites of the present invention.

The present invention demonstrates the pulsed laser deposition is capable of the formation of thin-film GaAs on silicon with outstanding quality.

The present invention also includes p-GaAs/n-Si and n-GaAs/p-Si hetero-structures produced by depositing thin-film GaAs on Si wafers with pulsed-laser deposition (PLD).

The method of the present invention demonstrates that p-type GaAs deposit upon n-type silicon forms a rectifying hetero-pairing with appealing optoelectronic features.

In general terms, the present invention includes a method for the laser deposition or ablation of a layer of gallium arsenide upon a silicon or silicon-bearing substrate. This method comprises the steps of (a) providing in a vacuum: (1) a target comprising a target surface bearing gallium arsenide; and (2) a substrate comprising a substrate surface bearing silicon; wherein said target surface and said substrate surface are in opposed alignment (i.e., at an angle less than 90 degrees); and (b) irradiating said gallium arsenide with a laser so as to vaporize said gallium arsenide, so as to cause said gallium arsenide to be deposited upon said silicon uniformly and in a substantially stoichiometric ratio.

The target and substrate surfaces may be placed in substantially parallel alignment to achieve uniform deposition or, where a greater area of the substrate is to be covered, the target surface may be arranged at an angle to the substrate surface to expose a greater area of the substrate surface to the GaAs plume. The degree of this angle will naturally depend upon how much of the substrate surface is to be exposed with greater angles exposing a greater surface. This angle will typically be between 20 and 90 degrees, depending upon the desired skew of the GaAs plume with respect to the substrate surface.

Substrates such as glass or other substrate materials may also be used depending upon the desired application of the GaAs films of the present invention.

The substrate may be actively heated or allowed to remain at ambient temperature.

The laser may be used with focusing optics to better energize the target. The advantage of pulsed laser deposition is that this method for the stoichiometric films to 20 exclusive evaporation of a target material with an intense laser pulse before the resultant energized atomic and molecular particles disproportions. Furthermore, with it appears that the lattice mismatch between silicon and GaAs does not affect the quality of the deposit layer. The present invention also makes possible the production of eighth large amount of GaAs films from a single portion of target material, thus holding forth the potential for drastic cost reduction. Furthermore, because the standard growth of GaAs is performed with extremely expensive methods such as molecular beam epitaxy (MBE) and the metal-organic chemical vapor deposition (MOCVD), it is very likely that the present invention will find the wide variety of applications in the several device-forming industries.

The method of the present invention allows a layer of gallium arsenide to be deposited upon said silicon with a smoothness variation is less than 100 nanometers, and even as low as less than 20 nanometers.

The method of the present invention in qualitative terms achieves these results by irradiating the target surface with a laser of anywhere from several milliwatts up to several watts, such that the correspondingly the equivalent continuous-wave power of a pulsed laser generates a laser fluence (energy per area) sufficient to cause said gallium arsenide to be explosively vaporized and deposited upon said substrate surface. Typical preferred values are in the range of from about 0.3 J/cm2 to about 2.5 J/cm2, although values outside this range may also be effective depending upon other variables such as distance between the substrate and the target, and the laser power applied. Accordingly, the present invention can be scaled based upon an appreciation of the present embodiments described herein.

For applications and devices requiring higher performance, it is preferred that the target surface consists essentially of gallium arsenide, and that the substrate surface consists essentially of silicon, most preferably substantially pure gallium arsenide and substantially pure silicon; i.e., >99% pure.

Depending upon the desired application, the gallium arsenide may be n-doped or p-doped, and/or the silicon likewise may be n-doped or p-doped. Both the gallium arsenide and silicon may be allowed to remain non-doped.

The target surface and substrate surface are typically disposed at a distance in the range of from about 1.0 cm to about 20 cm, while the applied laser fluence of said laser light is in the range of from about 0.3 J/cm2 to about 2.5 J/cm2.

Optionally, the target may be moved with respect to said substrate during step (b), preferably although not exclusively by moving said target surface within the plane defined thereby during step (b). Also, as an alternative, the substrate may be moved with respect to said target during step (b), also preferably although not exclusively by moving said substrate surface within the plane defined thereby during step (b). The target and/or the substrate may also be rotated about an axis perpendicular to their respective surfaces during step (b). The target and substrate may also be moved such that the ablation plume is moved through other movement patterns, such as a raster, linear or spiral patterns, in order that larger substrate areas or correspondingly patterned areas might be subjected to the uniform deposition of the present invention. The movement may be controlled through programmed logic control devices to obtain reproducibly accurate movements. This makes possible the production of larger articles of the invention and their correspondingly larger devices as described herein. Where desired, plume opaque masks of appropriate high temperature resistant materials, may also be employed to provide shaped deposition patterns.

Preferably, the method of the invention includes the steps of: (a) providing in a vacuum: (1) a target comprising a target surface bearing gallium arsenide; and (2) a substrate comprising a substrate surface bearing silicon; wherein said target surface and said substrate surface are in substantially parallel alignment; and irradiating said gallium with a laser of sufficient laser fluence so as to cause said gallium arsenide to be explosively vaporized and deposited upon said substrate surface, so as to cause said gallium arsenide to be deposited upon said silicon uniformly and in a substantially stoichiometric ratio, and whereby said layer of gallium arsenide deposited upon said silicon in has a smoothness variation is less than 100 nanometers, and most preferably less than 20 nanometers.

The present invention also includes a layered article of manufacture article comprising: (a) a first layer comprising silicon; and (b) a second layer comprising gallium arsenide; said gallium arsenide of said first layer being layered onto said silicon of said second layer uniformly and in a substantially stoichiometric ratio, and whereby said layer of gallium arsenide deposited upon said silicon in has a smoothness variation is less than 100 nanometers, and most preferably less than 20 nanometers.

The layers may be doped or non-doped as described above.

The present invention also includes a wide variety of electronic devices and circuits comprising the layered article of gallium arsenide upon silicon substrate. These include any electronic or optoelectronic device, such as multiplexers, photosensors, photodiodes or circuitry that would benefit from the present inventive articles as will be appreciated from the present disclosure.

For instance, the invention includes an electronic circuit comprising a rectifier, said rectifier comprising a layered article comprising: (a) a first layer comprising silicon; and (b) a second layer comprising gallium arsenide; said gallium arsenide of said first layer being layered onto said silicon of said second layer in a substantially stoichiometric ratio, and whereby said layer of gallium arsenide deposited upon said silicon has a smoothness variation less than about 100 nanometers.

The invention also includes in general terms a tunable photodiode comprising: (a) a diode structure having an input and output contacts, and comprising: (i) A first layer comprising silicon; and (ii) a second layer comprising gallium arsenide; said gallium arsenide of said first layer being layered onto said silicon of said second layer in a substantially stoichiometric ratio, and whereby said layer of gallium arsenide deposited upon said silicon in has a smoothness variation is less than 100 nanometers; and (b) an adjustable source of electrical potential connected to said input and output contacts, whereby the peak wavelength sensitivity of said diode to incident light thereupon may be tuned through application of said electrical potential.

The invention also includes memory/logic/multiplexer devices including a layered article of gallium arsenide upon a silicon substrate. A memory device can store digitized information over a long period of time. The stored information can be retrieved, deleted or overwritten by newer information. Normally, these structures are achieved with field effect transistors, and this may be done with the GaAs/Si multiplexer by charging a capacitance in the output channel (as an example).

Accordingly, the devices of the present invention include a memory device comprising: (a) a field effect transistor comprising a GaAs/Si composite comprising (i) a first layer comprising silicon; and (ii) a second layer comprising gallium arsenide; said gallium arsenide of said first layer being layered onto said silicon of said second layer uniformly and in a substantially stoichiometric ratio.

Also included in the invention is a logic device comprising: (a) one or more input lines associated with one or more output lines according to a logic algorithm; (b) at least one signal input device associated with said one or more input lines, and least one signal output device associated with said one or more output lines; at least one of said at least one signal input device and at least one signal output device being optical or electrical; and (c) a logic algorithm device for associating said one or more input lines associated with one or more output lines, said device comprising: (i) a first layer comprising silicon; and (ii) a second layer comprising gallium arsenide; said gallium arsenide of said first layer being layered onto said silicon of said second layer uniformly and in a substantially stoichiometric ratio. As an example, a logic device of the present invention may combine one or more input lines to one or more output lines according to the Boolean Logic. The signal type of input or output lines may be optical or electrical.

The articles of the present invention may also be used to make a multiplexer device comprising: (a) a plurality of input lines associated with a respective number of data sources, and an output line, and (b) a data selector; each of said input lines adapted to transfer data to said output line when said data selector selects it, said data selector comprising: (i) a first layer comprising silicon; and (ii) a second layer comprising gallium arsenide; said gallium arsenide of said first layer being layered onto said silicon of said second layer uniformly and in a substantially stoichiometric ratio. A variation of this device is one wherein the plurality of input lines are optical input lines and wherein said output line is an electrical output line, and wherein the data on the optical input line once selected by the data selector is converted and transferred to the electrical output line when a bias voltage is applied to said device. The multiplexer may have many input lines and one output line. The information on the chosen input line is transferred to the output line when the device is enabled. The device thus acts as a "data selector" in that it selects a data source and transfers its data to the output. A hybrid multiplexer of the present invention may have many optical input lines and one electrical output line. The information on the chosen optical input line is converted and transferred to the electrical output line when the applied bias voltage enables the device. This device thus functions as a data selector in that it selects an optical data source by the applied bias voltage and transfers its data to the electrical output.

The invention also includes an apparatus for producing GaAs/Si composites by laser ablation, said apparatus comprising: (a) a source of a beam of laser light; (b) a chamber adapted to maintain a vacuum in its interior while allowing passage of said beam of laser light into its interior; (c) a target comprising a target surface and disposed in said chamber and in the path of said beam of laser light, said target surface bearing gallium arsenide; (d) a substrate comprising a substrate surface and disposed in said chamber, said substrate surface bearing silicon, and aligned in substantially parallel alignment; and wherein source of laser light is of sufficient power, and said target surface and substrate surface of at such sufficient proximity that, when said target surface is irradiated, said gallium arsenide vaporizes and is deposited upon said silicon uniformly and in a substantially stoichiometric ratio.

It is preferred that the laser light is provided by a pulsed laser, and that the target surface and substrate surface are disposed at a distance in the range of from about 1.0 cm to about 20 cm. It is also preferred that the applied laser fluence of said laser light is in the range of from about 0.3 J/cm2 to about 2.5 J/cm2. The apparatus may also include a moveable support attached to said target so as to be capable of moving said target with respect to said substrate, such as an electric motor inside the chamber or a motor driving a shaft that transmits movement to the moveable support. In most applications, it is preferred that the moveable support is attached to said target so as to be capable of moving said target surface within the plane defined thereby. Likewise, a moveable support may be attached to said substrate so as to be capable of moving said substrate with respect to said target, including moving said substrate surface within the plane defined thereby. A rotating support may be used to rotate said target about an axis perpendicular to said target surface, and/or to rotate said substrate about an axis perpendicular to said substrate surface.

BRIEF DESCRIPTION OF THE DRAWINGS

Novel features and advantages of the present invention, in addition to those mentioned above, will become apparent to those skilled in the art from a reading of the following detailed description in conjunction with the accompanying drawings summarized as follows:

FIG. 6a is a plan view of a device demonstrating the rectifying properties of a device in accordance with one embodiment of the present invention;

FIG. 6b is a graph representing the I-V characteristics of the device shown in FIG. 6a.

DETAIL DESCRIPTION OF PREFERRED EMBODIMENT(S)

In accordance with the foregoing summary, the following is a more detailed description of the preferred embodiments of some of the present inventions which are considered to be the best mode thereof.

With respect to the preferred embodiment of the deposition of the present invention, the GaAs ablation used the 532 nm emission of a Nd:YAG laser (10 Hz repetition rate; 6 ns pulse) with a fluence of 0.79-0.84 J/cm2. The laser spor size was about 1.8 mm×2.5 mm (elliptical). The thicknesses of the films were approximately 0.5 μm. During the deposition of about one hour in duration, the substrate was not heated and the ambient pressure was kept at about 10-6-10-7 torr. X-ray analysis showed that the films contain crystallites and by means of an atomic force microscope (AFM), it is demonstrated that the film surfaces are fairly smooth. Using a monochromatic light source and by means of electrical contacts on the top and the rear of the sample, we measured the photocurrent (PC) through the junction using lock-in technique. These measurements showed that the photocurrent spectra of the p-GaAs/n-Si diode crucially depend on the applied bias. At −0.7 V (reverse bias) the photocurrent maximum is at 930 nm, while at +0.5 V, the photocurrent maximum lies at 1056 nm. These maxima are in the vicinity to the bandgap of GaAs and Si, respectively. In other words, it is possible to switch between the spectral sensitivity of GaAs and Si via an applied electric field. The device can be either used as a photo-detector for which the sensitive wavelength range can be easily chosen by the applied bias or as hybrid multiplexer to convert two optical inputs into one electrical output.

Figure 1:
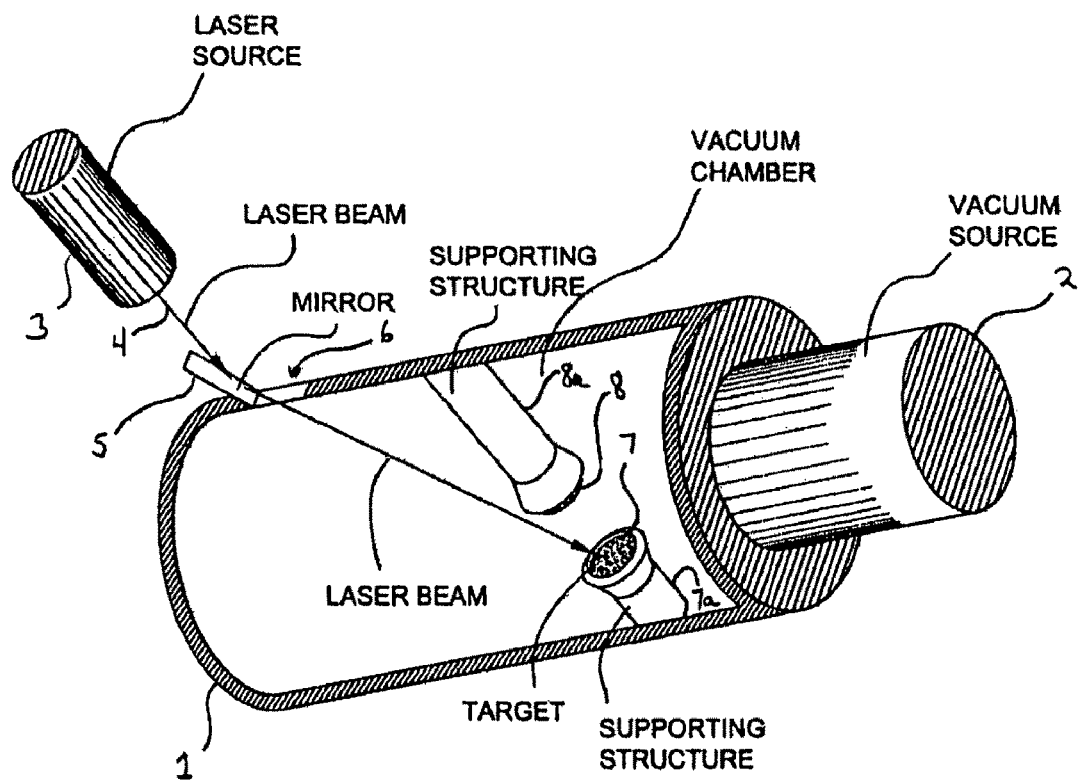
FIG. 1 is a perspective schematic view of the apparatus in accordance with one embodiment of the present invention.

FIG. 1 shows a system for pulsed laser deposition including a vacuum chamber 1 include vacation with a vacuum source 2. Vacuum chamber 1 is configured for sustaining a low pressure atmosphere of approximately 10-6 Torr. A laser source 3 emits a pulsed laser beam 4 that is deflected by a mirror 5 through a window 6 in the chamber to a target 7. The laser is suitable for ablating the surface of the target 7. Preferably, the laser is a Nd:YAG type laser configured for emitting six nanosecond pulses at a repetition rate of 10 Hertz at a wavelength of 532 nm producing an energy of 1-2 Joule/centimeter—2 at the target.

Figure 2:
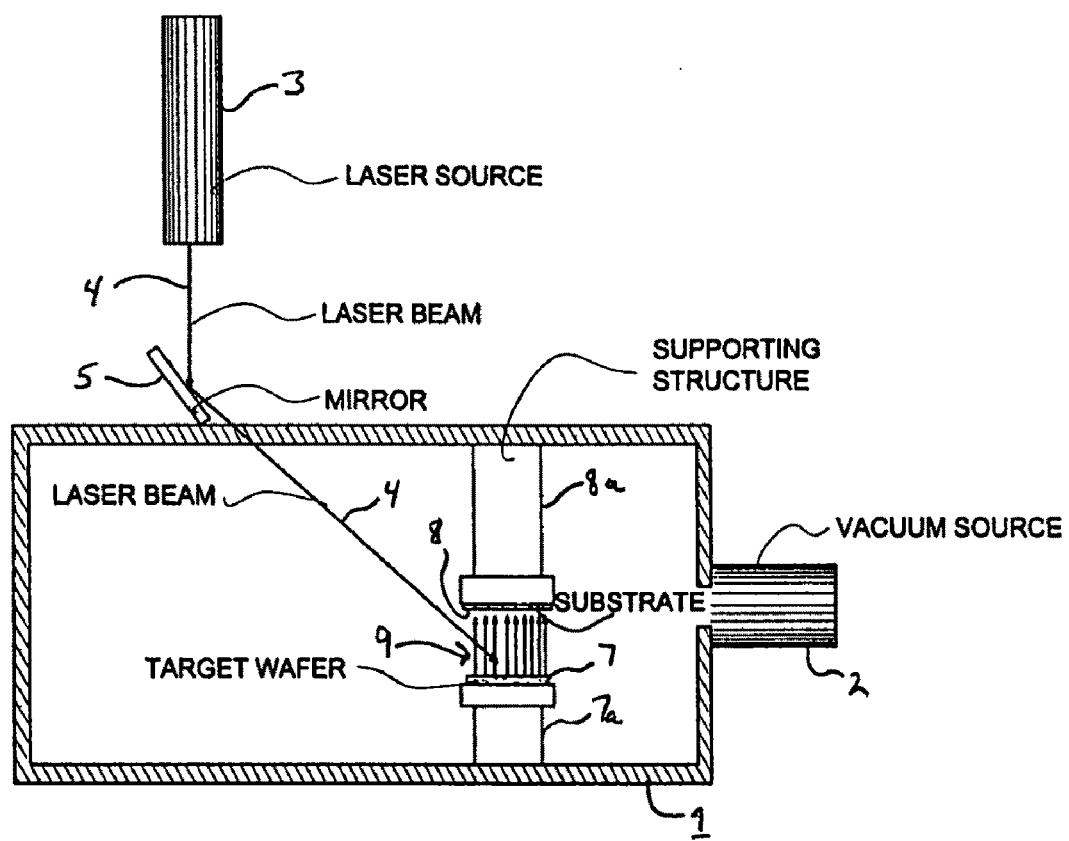
FIG. 2 is a cross-section schematic view of an apparatus in accordance with one embodiment of the present invention.

As seen in FIG. 2, in operation, the laser beam 4 strikes the surface of a GaAs wafer target 7 (i.e., p-type) positioned on a supporting structure 7a. The surface layer of the target 7 is a ablated by the radiation of the pulsed laser beam 4 and the decomposed target material is projected in this case substantially perpendicular from the surface of the target 7 as a beam of energized atomic a molecular particles 9. A substrate 8 is positioned in a substantially parallel orientation with respect to and directly opposing the surface of the target wafer 7. The surface of target 7 and the surface of substrate eight are preferably disposed at a distance of from about numeral 2 cm to about 6 cm. Typically, the substrate 8 and will remain unheated will remain at an ambient chamber temperature. The substrate 8 they deducted of silicon with N-type doping. A deposition occurs as the energized atomic particles from the target 7, in the form of a molecular beam of particles, are deposited as a thin stoichiometric film on the substrate 8. The deposition on the substrate 8 is extremely smooth surface on the order of nanometers in smoothness variation.

Figure 3:
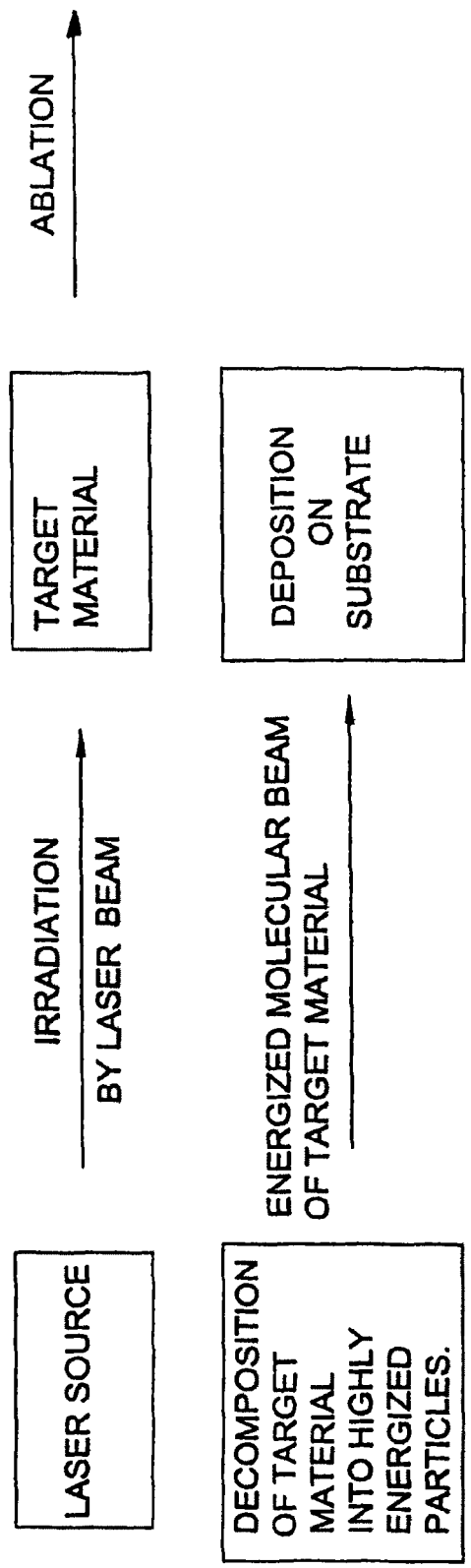
FIG. 3 is a basic schematic of a method in accordance with one embodiment of the present invention.

FIG. 3 illustrates a schematic diagram of a method in accordance with one embodiment of the present invention.

Figure 4:
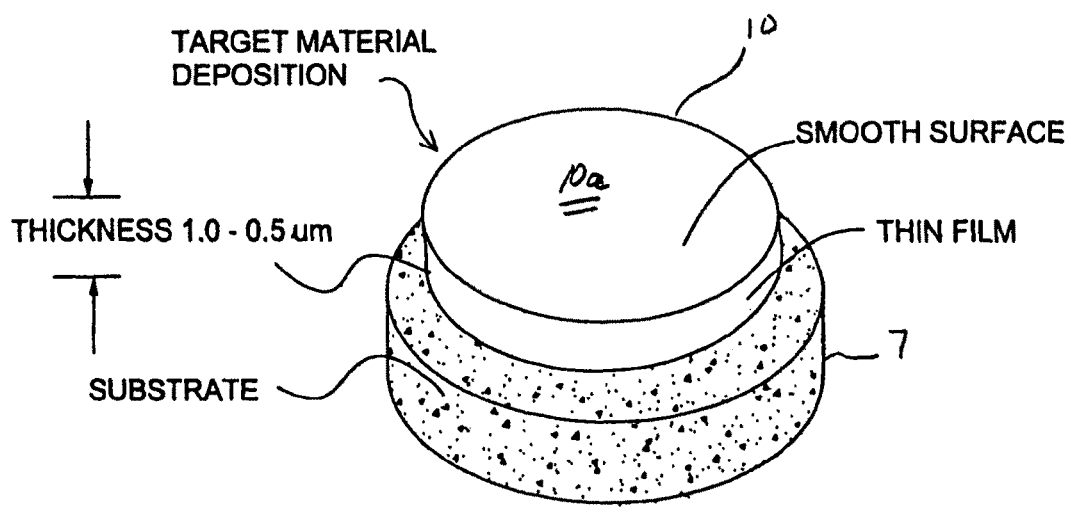
FIG. 4 is a perspective view of a substrate bearing a layer of deposited target material in accordance with one embodiment of the present invention.

FIG. 4 is a perspective view of a substrate 7 having deposited thereupon a thin film of a target material 10 following laser ablation in accordance with present invention. Figure numeral for shows the deposited material 10 which is a thin stoichiometric target material film having a thickness in the range of from about 1.0 to about 0.5 micrometers to surface 10a is extremely smooth. The combination of the target material film 10 and the substrate (i.e., silicon) provides a heterostructure that may be used for instance as a rectifying photodiode.

Figure 5A:
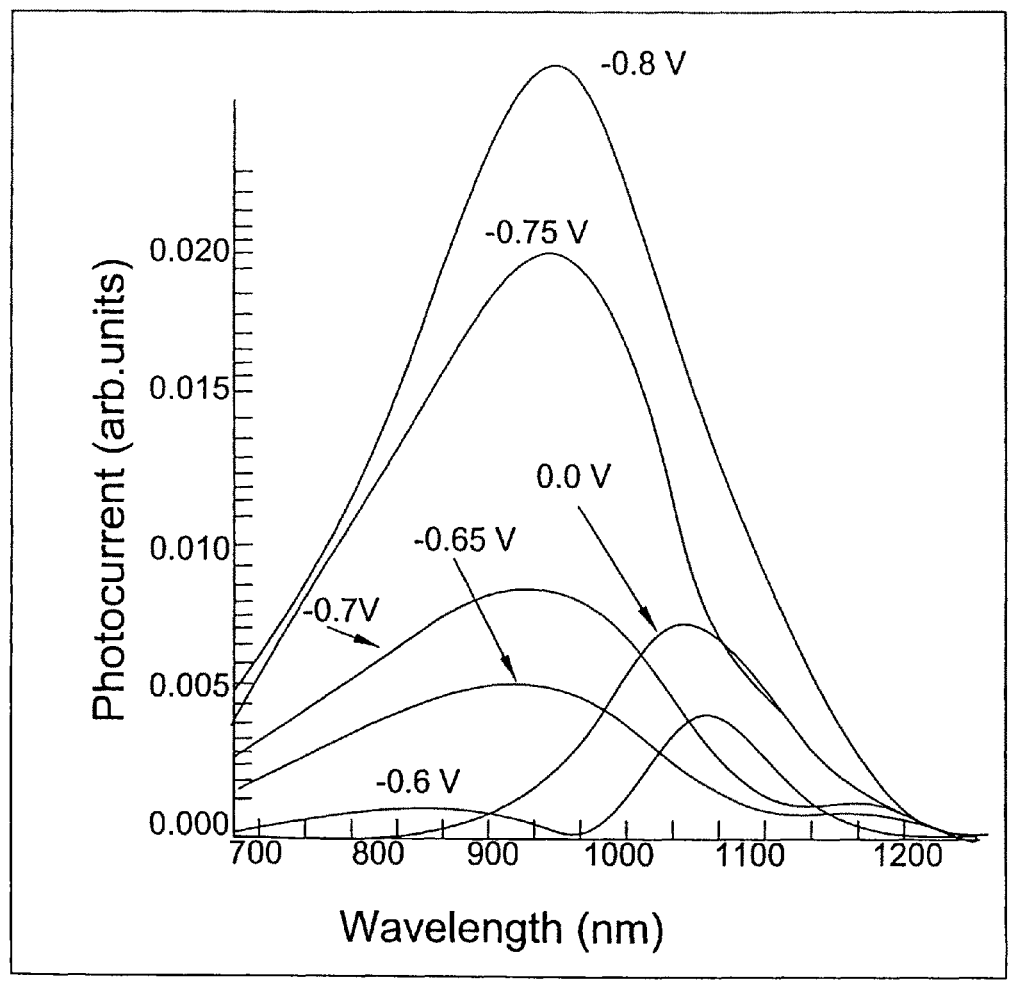
FIG. 5a is a graph representing the results obtained through an article of manufacture in accordance with one embodiment of the present invention.

FIG. 5a presents a graphical representation of the results that may be obtained in accordance with one embodiment of the present invention. FIG. 5 shows the advantageous optoelectronic features of the photodiode that may be obtained from article of manufacture of the present invention. Such photodiode are capable of a tunable photoresponse. For instance, when a reverse bias between about −0.62 v and about −0.8 v is supplied to the photodiode, a shift in wavelength between as much as from 700 to 1180 nm can be achieved, wherein the photocurrent levels have a reverse bias of from about −0.75 to −0.8 v thus providing the combination of the greatest levels of photocurrent and ranges of wavelength. Alternate bias level of −0.7 v, −0.6 v, and that −0.6 v as shown provide selected elevated photocurrent and wavelength combinations.

Although not limited to theory of operation, it is believed that, in the case of p-GaAs/n-Si, only the electron-hole pairs generated in the depletion at the p-GaAs/n-Si interface or within a diffusion length of the depletion area contribute to the photocurrent. Accordingly, in the range of the GaAs absorption, the heterojunction exhibits photocurrent only if the depletion width is comparable to that in the silicon substrate or, at least, the diffusion length of the minority carriers in GaAs (electrons) is long to reach the depletion region in the silicon substrate. At sufficiently high reverse biases, the condition seems the fulfilled, whereas at lower reverse biases or zero bias the electrons are mostly trapped before an effective contribution to the photocurrent takes place.

Figure 5B:
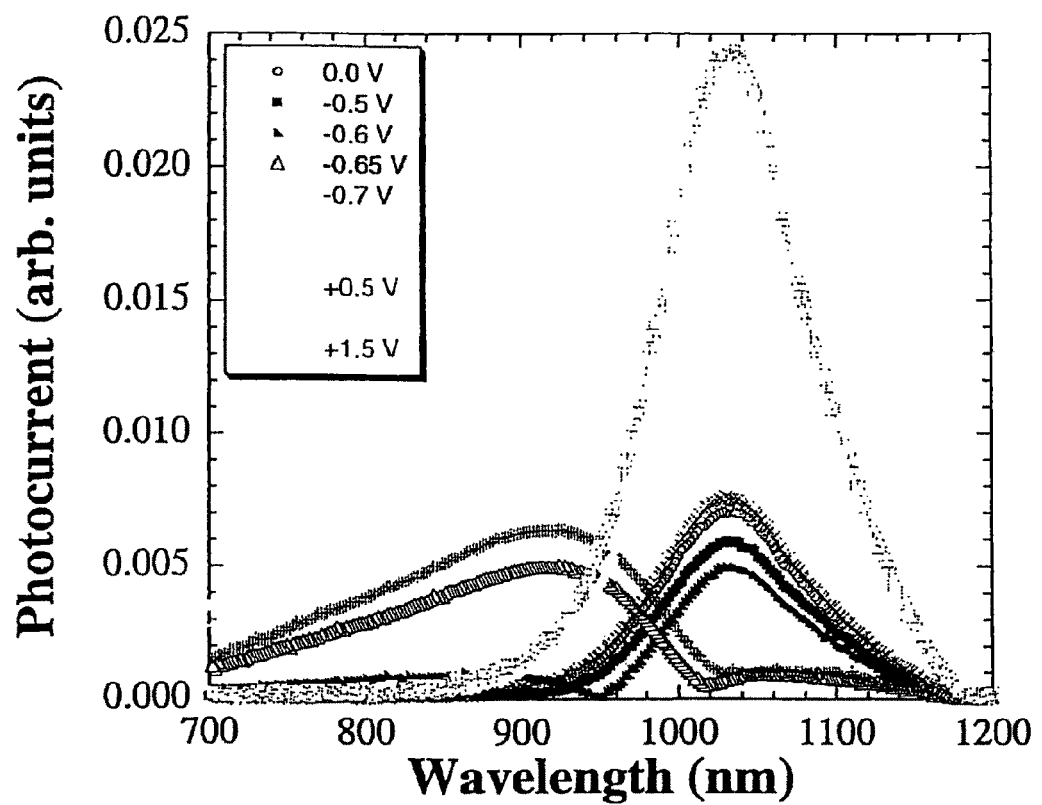
FIG. 5b is another graph representing the results obtained through an article of manufacture in accordance with one embodiment of the present invention.

FIG. 5b likewise shows the tunable photoresponse that may be achieved through the present invention. FIG. 5b shows the dependence the photocurrent on the applied bias, and shows the photocurrent in arbitrary units obtained with positive and negative biases of different voltages.

Figure 5C:
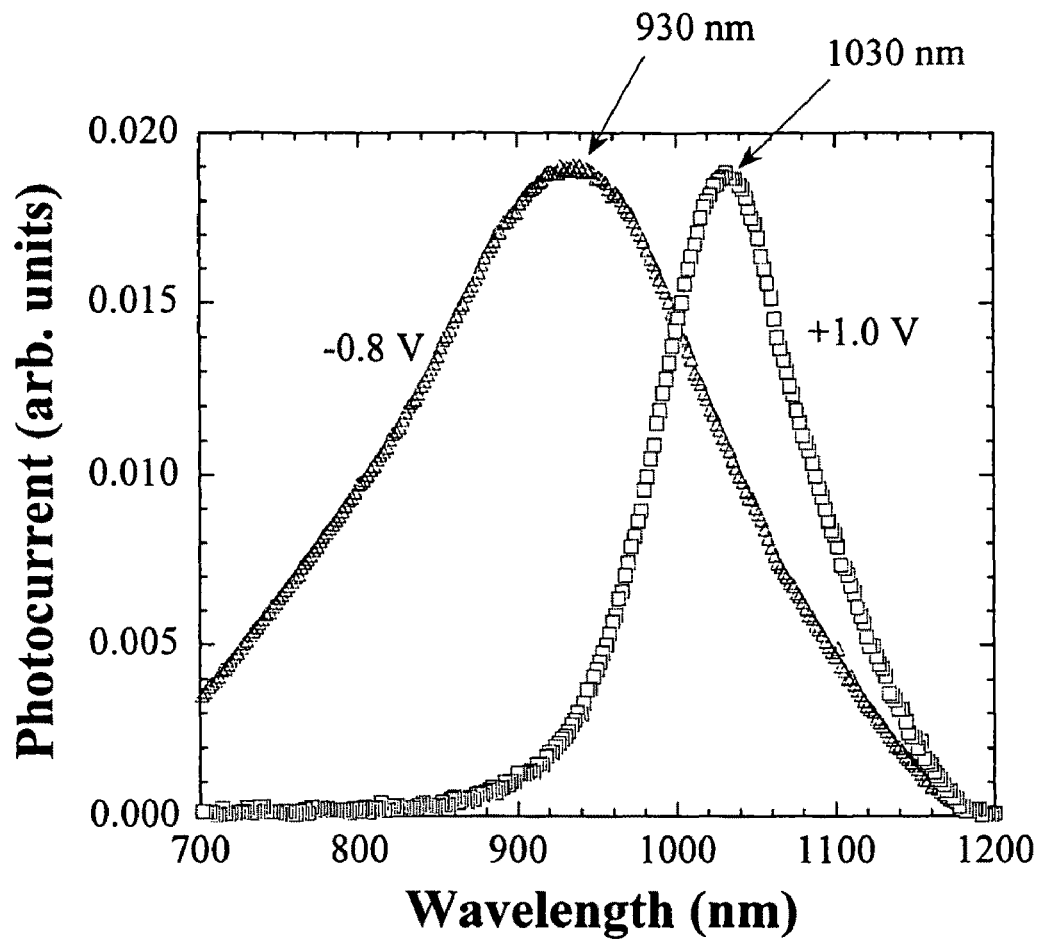
FIG. 5c is another graph representing the results obtained through an article of manufacture in accordance with one embodiment of the present invention.

FIG. 5c shows the photocurrent of a p-GaAs/n-Si sample. The p-GaAs was deposited by means of pulsed laser deposition on an n-Si substrate.

Figures 6A, 6B:
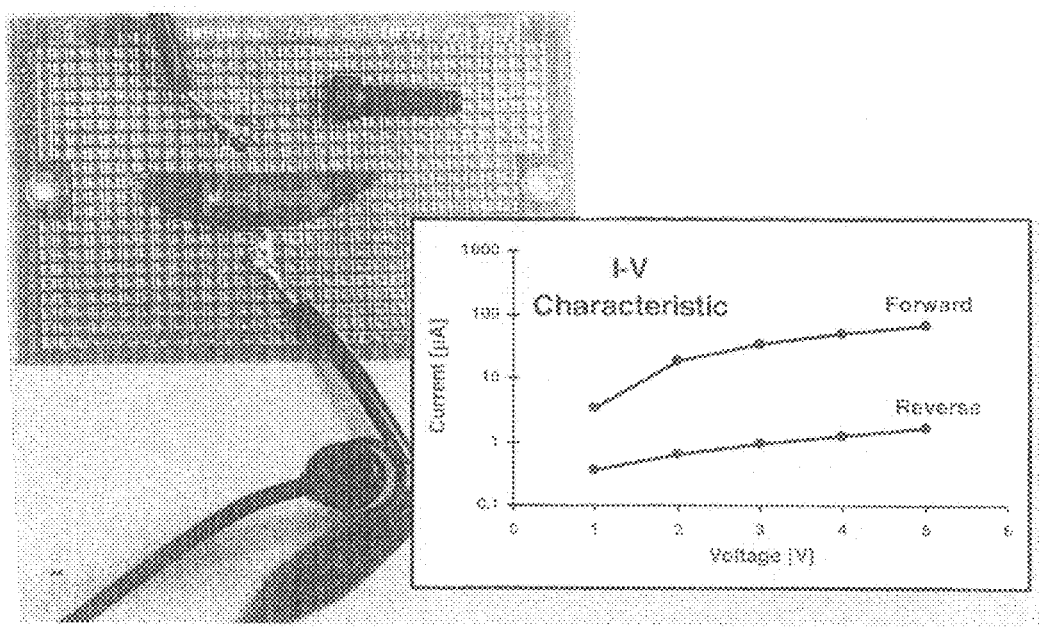

FIG. 6a is a plan view of a device demonstrating the rectifying properties of a device in accordance with one embodiment of the present invention, with FIG. 6b showing the I-V characteristics of the device shown in FIG. 6a.

Figure 7:
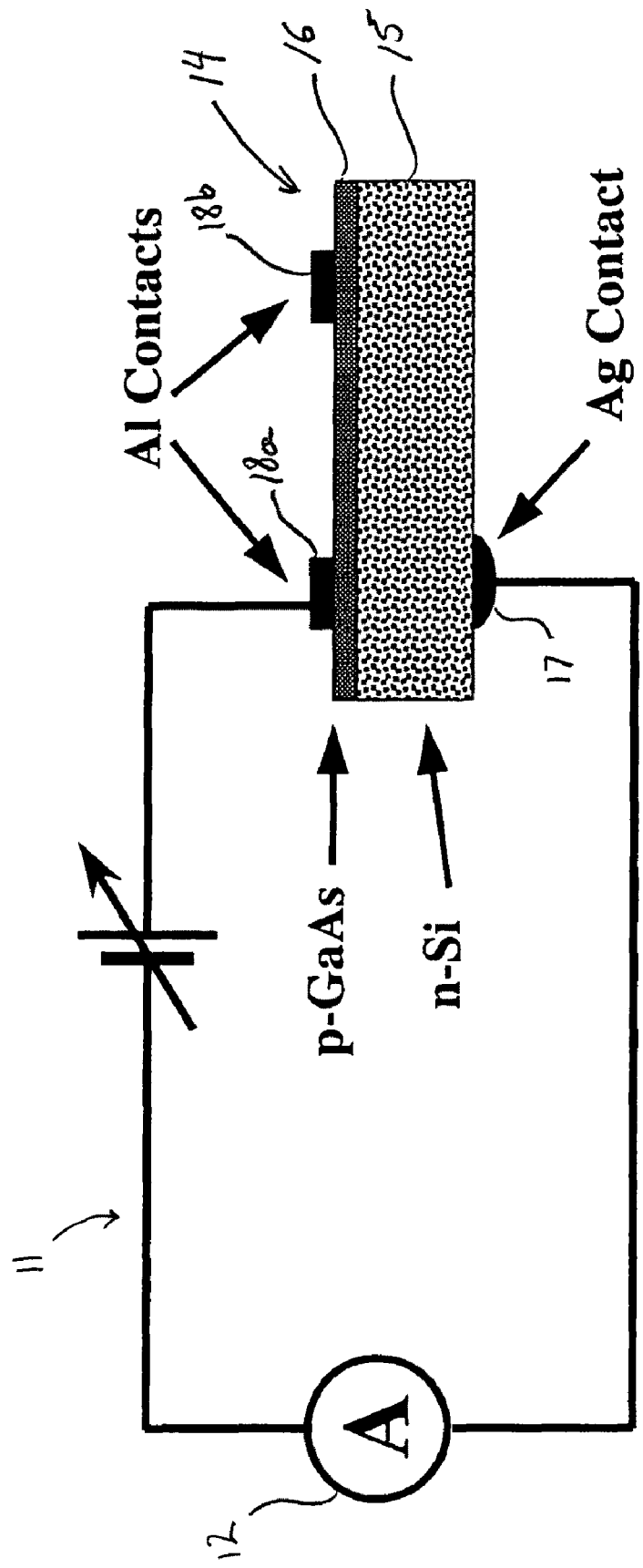
FIG. 7 is a schematic of the device shown in FIG. 6, in accordance with one embodiment of the present invention.

FIG. 7 is a schematic of the device shown in FIG. 6 showing circuit 11 containing current source 12 and variable power supply 13. FIG. 7 also shows a layered article 14 comprising an n-Si layer 15, a p-GaAs layer 16, a silver contact 17 and aluminum contacts 18a and 18b.

Figures 8A, 8B:
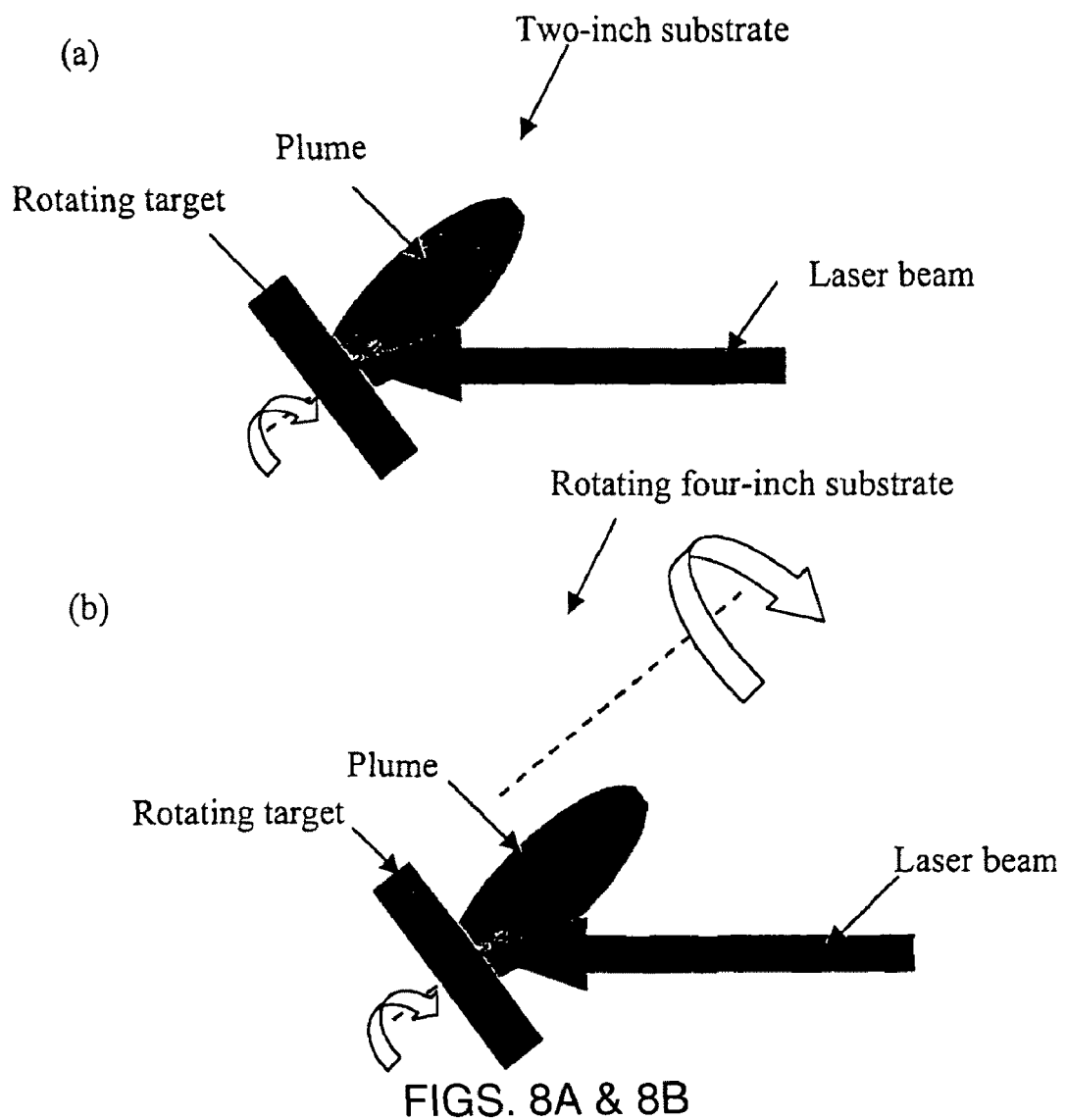
FIG. 8 is schematic of two embodiments of the present invention involving moving targets and/or substrates, in accordance with another embodiment of the present invention.

FIG. 8 is schematic of two embodiments of the present invention involving moving targets and/or substrates, in accordance with another embodiment of the present invention. The target and/or substrate may be moved by the use of any mechanical arrangement not inconsistent with the deposition method of the present invention, such as mechanical motors and actuators that may provide, for instance, circular, elliptical, raster-type or spiral movements, to allow for deposition over a greater area of a given substrate.

Because the pulsed laser deposition of GaAs a widely unknown, experiments were conducted with unheated substrates. Furthermore, one should bear in mind that the thermal expansion coefficients of silicon ($2.60 \times 10^{-6}$ C-1) and GaAs ($5.73 \times 10^{-6}$ through C-01) are notably different, which eventually causes the film to peel off the substrate during cooling after deposition.

The method of the present invention may also be used to deposit multiple heterostructures and pn homojunctions may be prepared with provided preferably that the layers are not to thick (i.e. a$</$=500 nm). In this regard, homojunctions p-GaAs/n-GaAs have been prepared by employing pulsed laser deposition in accordance with the present invention.

One of the advantages of the present invention is that provides for the simplicity of assembling GaAs on silicon with a structure that is capable of providing a hybrid device for optically interface electronics. From the visible (<700 nm) to the near infrared (11 50 nm), it is possible to achieve technically useful switching ratios between low and high photocurrent (i.e. see the ratio between the specter at −0.64 and −0.8 volts) with rather small voltages, which can be easily provided by TTL logics and solar cells. Accordingly, is also possible to use the devices of the present invention for survey applications, which use the output of low-voltage sources such as piezoelectric crystals.

As to the smoothness of the film to the present invention the smoothness can be appreciated by examining the deposited target material film with a scanning microscope. This examination revealed a virtual absence of disuniformities or scratches on the surface. Achieved by use of an atomic force microscope show random distribution of graders and clusters on the surface with a death-of typically no more than 200 nm. However, it should be emphasized that this is not a measure of an overall film roughness but indicates the appearance of the local features. The smoothness of the films produced in accordance with present invention may be as smooth as 1 nm, and compare favorably with GaAs deposited on silicon through molecular beam epitaxy.

Figure 9:
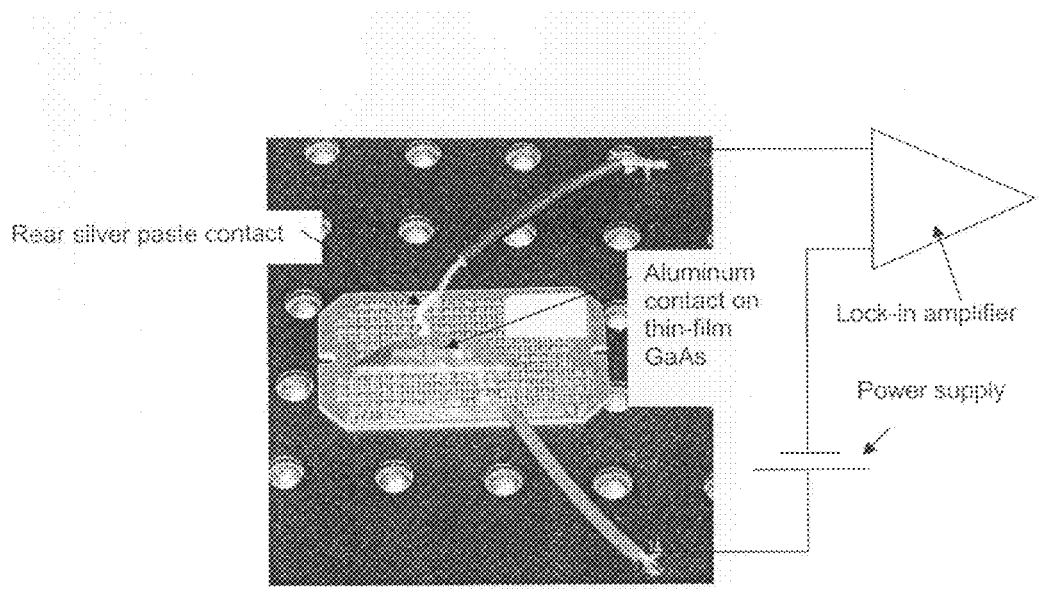
FIG. 9 shows a photograph of a sample article of manufacture produced in accordance with one embodiment of the present invention and attached as shown in a schematic to the PC circuit used for testing.

With respect to an example of a multiplexer in accordance with the present invention, two hetero-structures (p-GaAs/n-Si and n-GaAs/p-Si) have been produced with PLD described herein. The deposition was achieved by focusing intense laser pulses on a rotating target material. The laser pulse causes an enormous increase in the target surface temperature up to several thousand degrees, far beyond the melting point of GaAs (1511 K). This concentrated thermal energy breaks the bonds and the material ablates in an explosive way. The event is so fast that the target material is not afforded sufficient time to disproportionate and the ablated material condenses as a stoichiometric thin-film on the substrate.7 The target material was ablated by mounting the Si substrate wafer face to face to the GaAs target with a gap of about 6 cm. For the ablation, the second harmonic emission at 532 nm of a Nd:YAG laser was used with a pulse duration of 6 ns and a repetition rate of 10 Hz. The beam was focused to a spot size of 1.8 mm 2.5 mm corresponding to an ellipse with an area of 3.5 mm2. The ablation time was about 60 minutes and the laser flux was kept between 0.79-0.84 J cm-2 during this time. The process happened without heating the substrate in a vacuum chamber with an ambient pressure of 10-6 torr. For the first sample, (100) p-type GaAs:Zn (1019 cm-3) and (100) n-type (1014 cm-3-1015 cm-3) Si:Ph 2-inch wafers were used and, for the second sample, (100) n-type (1018 cm-3) GaAs:Si and p-type (1014 cm-3-1016 cm-3) Si:B 2-inch wafers. After the film deposition of both devices, Al contacts were evaporated on the GaAs film, and the Si substrate was provided with a conductive silver paste. By this means, the current-voltage (I/V) characteristic and the photocurrent (PC) across the junction were measured. The PC was measured with a lock-in amplifier chopping the light excitation at 107 Hz. FIG. 9 shows the sample and the schematic PC circuit used.

Figure 10:
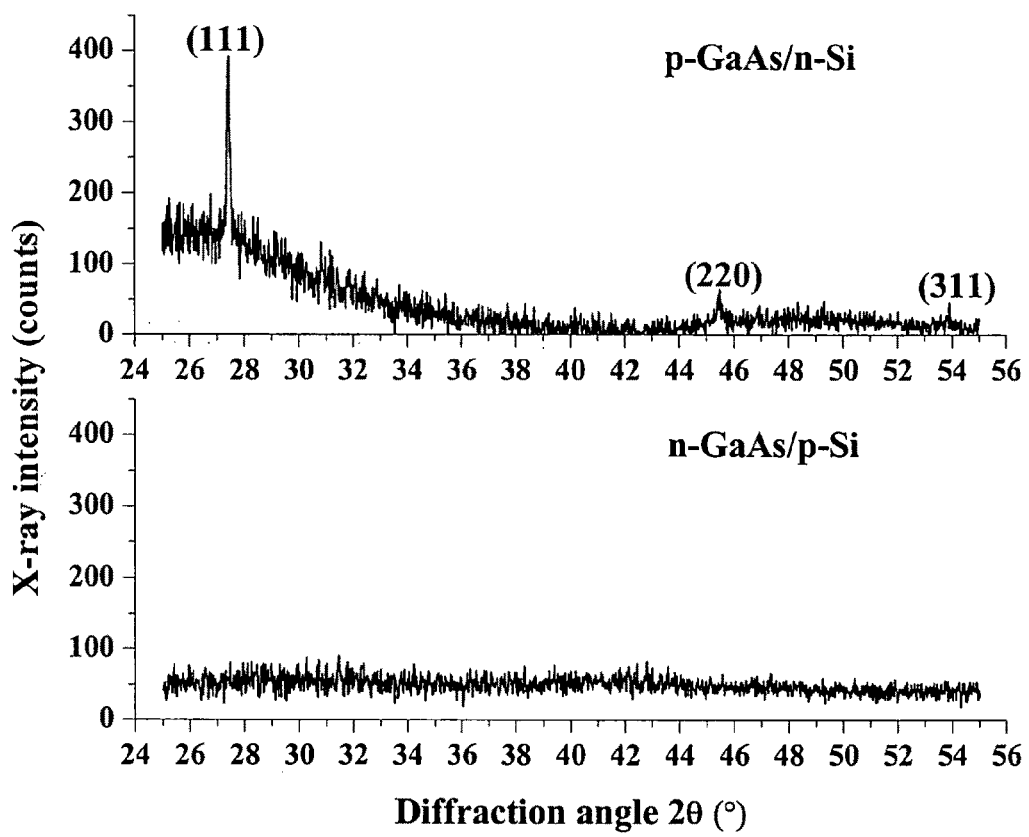
FIG. 10 is a graph of X-ray diffraction patterns for two hetero-structures (p-GaAs/n-Si and n-GaAs/p-Si) produced by PLD in accordance with one embodiment of the present invention.
Figure 11:
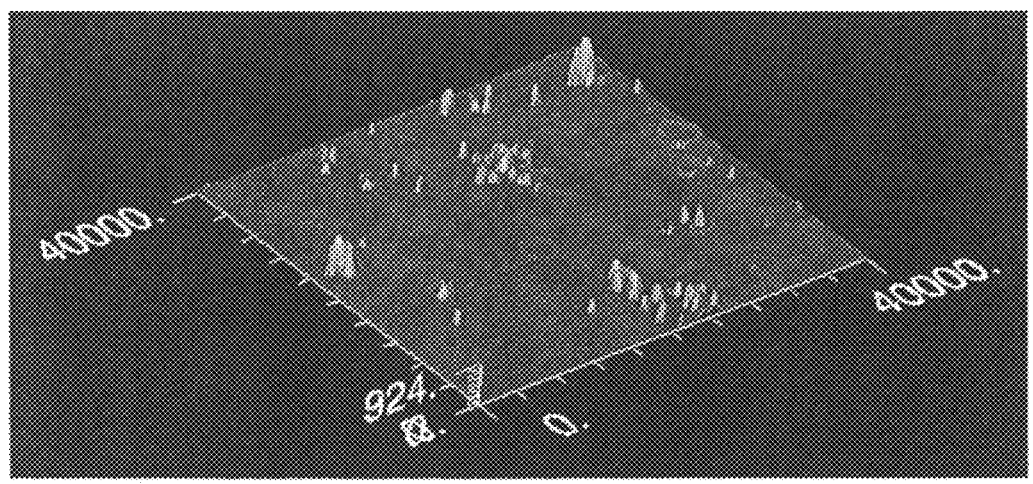
FIG. 11 is an AFM image of the surfaces of a p-GaAs/n-Si article of manufacture produced in accordance with one embodiment of the present invention (units in nm)
Figure 12:
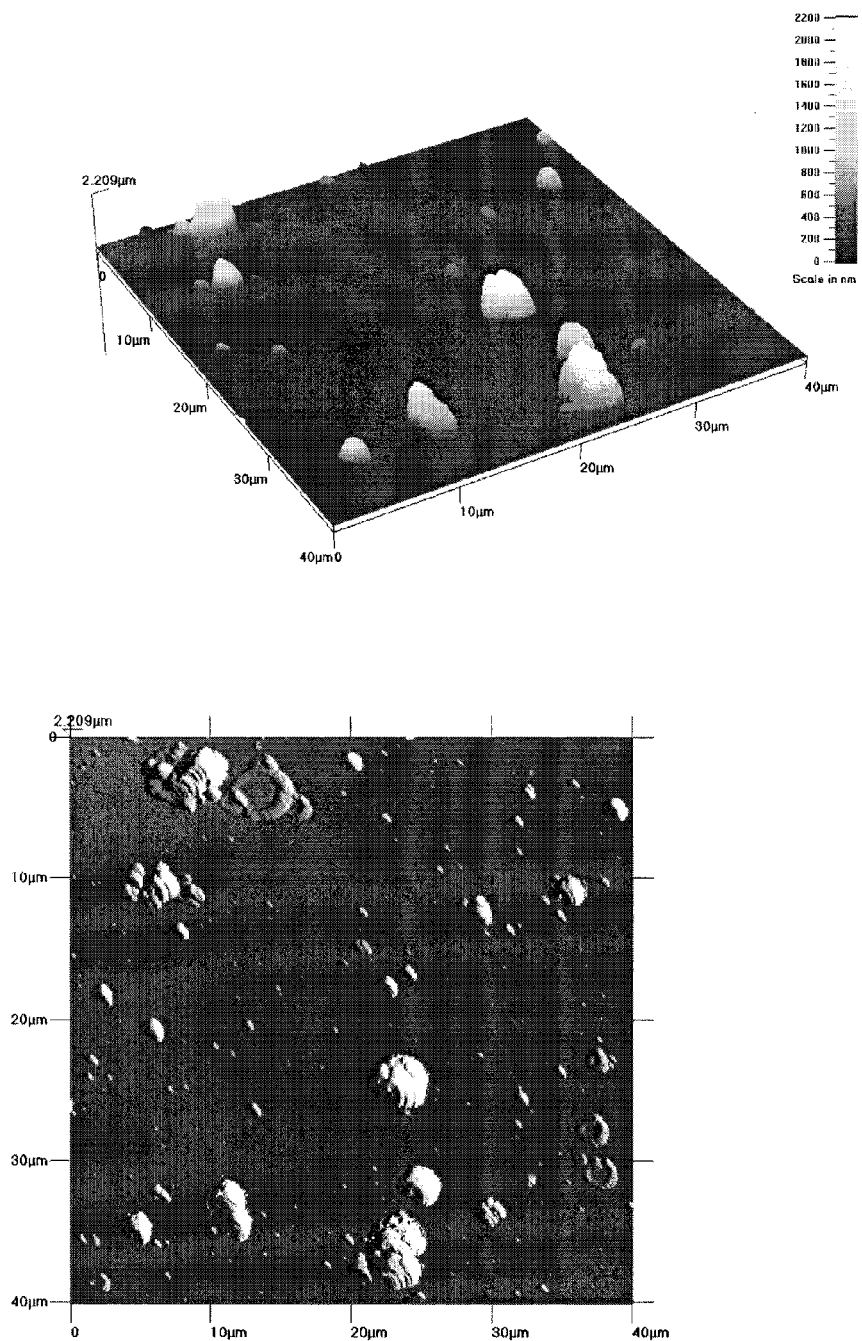
FIG. 12 is a three dimensional and top AFM image of the surface of the n-GaAs/p-Si article of manufacture produced in accordance with one embodiment of the present invention (units in μm)

The crystallographic structures of the thin-film GaAs samples were investigated by an x-ray powder diffractometer using the CuKα line (A=1.540562 Å). FIG. 10 is a graph of X-ray diffraction patterns for two hetero-structures (p-GaAs/n-Si and n-GaAs/p-Si) produced by identical PLD parameters in accordance with one embodiment of the present invention. The Si substrate: (100) orientation, lattice constant 5.43 Å, and band gap 1.12 eV. The GaAs target: (100) orientation, lattice constant 5.65 Å, and band gap 1.42 eV. For the sample p-GaAs/n-Si (Target: Zn doped GaAs, 1019 cm-3; Substrate: Ph doped Si wafer, 1014-1015 cm-3), diffraction patterns at 2θ=27.4°, 2θ=45.4° and 2θ=53.9° have been observed. These reflections correspond to the Miller indices (111), (220), and (311) of the GaAs zincblende crystal structure. The broad background is an indication that, as for the GaAs/glass samples,16 the crystallites are embedded in an amorphous texture. Looking at FIG. 10, one might be tempted to say that the p-GaAs/n-Si sample shows more crystallinity than the n-GaAs/p-Si sample (Target: Si doped GaAs, 1018 cm-3; Substrate: Bo doped Si wafer, 1014-1016 cm-3). It was estimated that the thickness of the films was at most 0.5 μm. As a consequence, the portion of the x-ray signal related to the films is fairly weak and a thinner film in the case of the n-GaAs/p-Si sample might cause the absence of patterns. The substrate is crystalline Si with (100) orientation and because of selection rules the (100), (200) and (300) peaks of the substrate do not appear in FIG. 10. The first observable peak is the (400) reflex at 2θ=66.0°. We should stress in this context that the (400) reflex is considerably broadened after PLD took place. At 532 nm, the laser pulses are highly absorbed by the GaAs target and the absence of clusters in the ablation plume cannot be ruled out. In this regard, while not limiting the invention to any phenomenon, it is possible that the impinging GaAs clusters degrade the Si substrate. Indeed, as shown in FIGS. 10 and 11, traces of cluster impacts have been located with an atomic force microscope (AFM). The density of craters, however, does not seem high enough to explain the modification of the Si crystal structure. Furthermore, clusters change the morphology of the surface but to see a broadening of the (400) reflex, the bulk of the substrate needs to be modified. We believe that the reason for the modification of the crystallinity of the Si substrate is the expose to the heat of the ablation plume for one hour. Based on this observation, it appears that the crystallinity of the GaAs film depends not only on the intrinsic deposition process of GaAs but also on collateral effects of the plume on the substrate.

Figure 13:
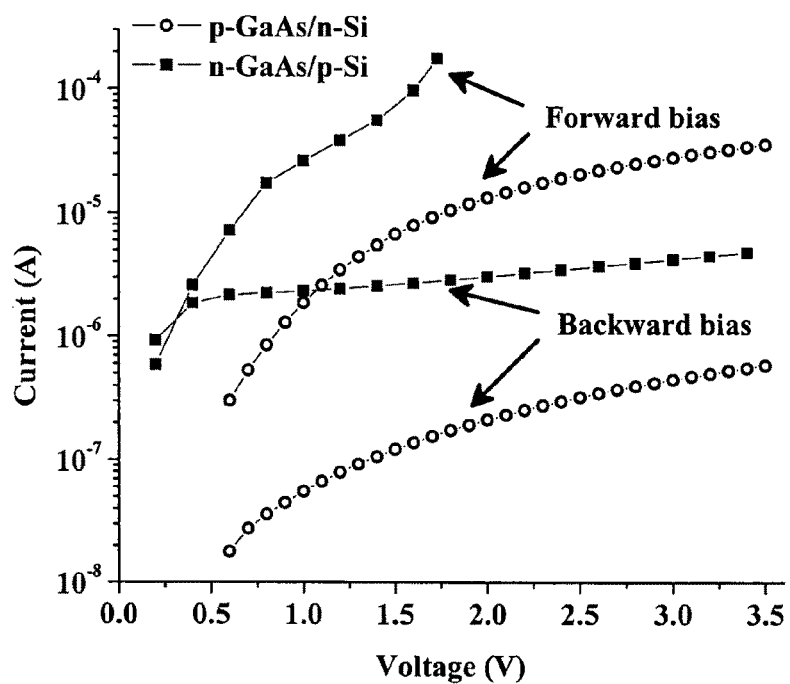
FIG. 13 is a graph showing the I/V characteristics of p-GaAs/n-Si and n-GaAs/p-Si articles of manufacture produced in accordance with one embodiment of the present invention.

FIG. 13 shows the rectification properties of the articles made in accordance with the invention. The results demonstrate that the doping of the target was successfully transferred to the substrate to some certain extent. Specifically, the n-GaAs/p-Si sample exhibited good relative rectifying features. The forward current increases fairly proportional with the applied bias, whereas the backward current remains almost constant over the plotted voltage range. The fact that the n-GaAs/p-Si sample forms the better diode than its counterpart is supportive of the indications above that the difference in the crystallinity is a thickness effect rather than a quality difference between the samples. It is possible that GaAs:Si deposits in a smoother way on Si than GaAs:Zn by reducing the variety of involved elements to the number three. It is also conceivable that the diverse atomic masses of the dopants Zn (65.38) and Si (28.09) cause a difference in the deposition, which alters the electric properties of the GaAs/Si hetero-pairing. However, these theories in no way limit the invention.

Figure 14A:
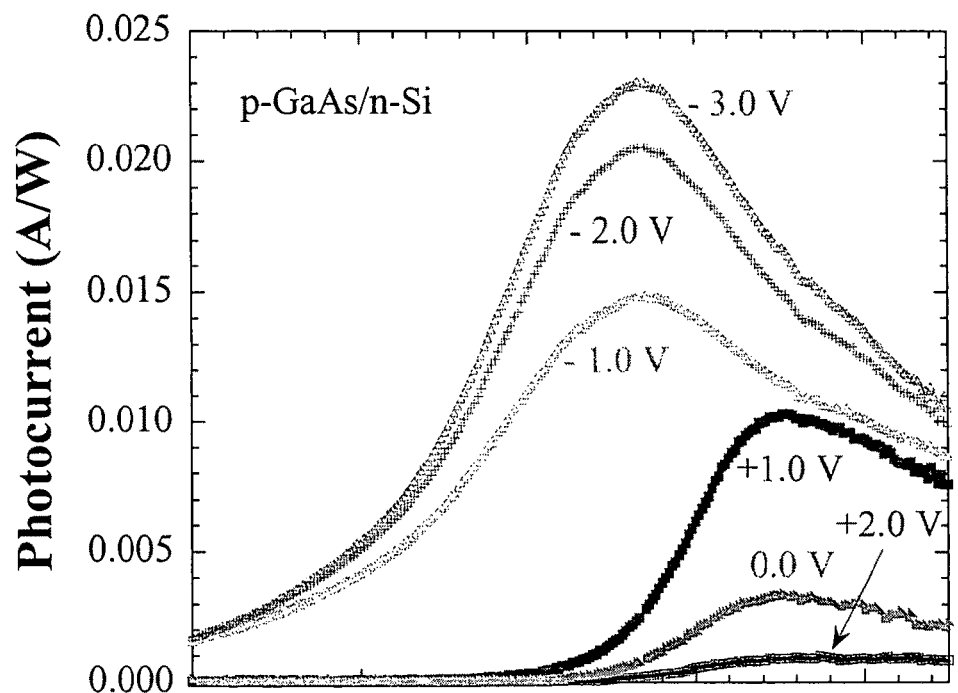
FIGS. 14a and 14b are graphs showing respectively photocurrents (PC) generated from (a) p-GaAs/n-Si and (b) n-GaAs/p-Si made in accordance with one embodiment of the present invention.
Figure 14B:
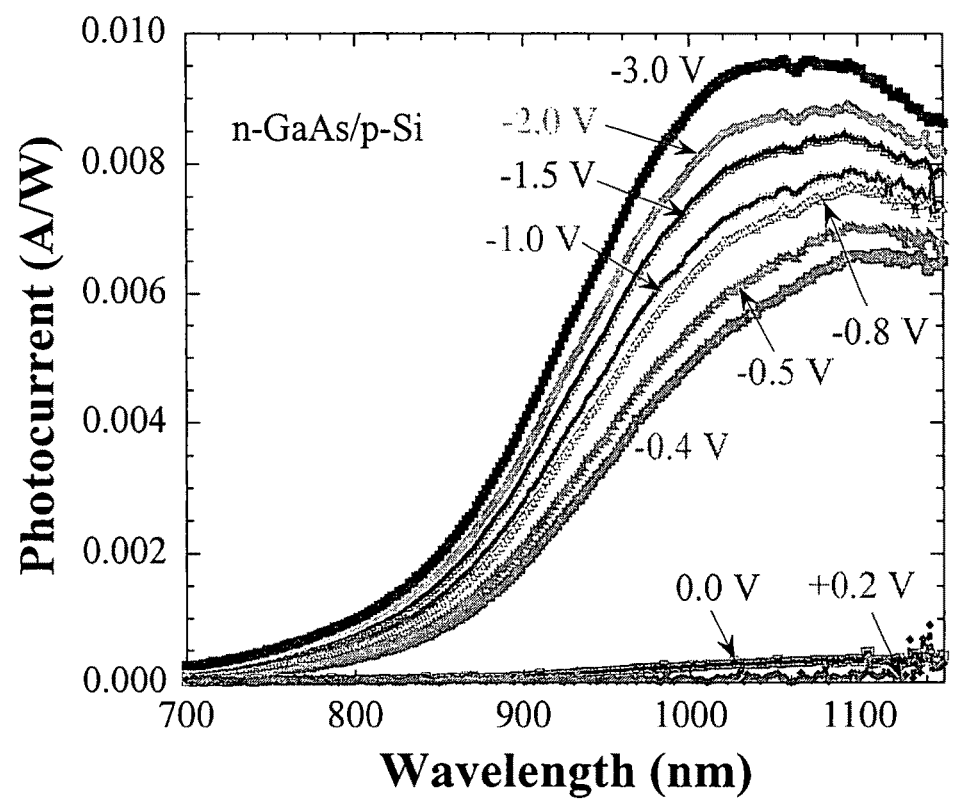
Figure 15:
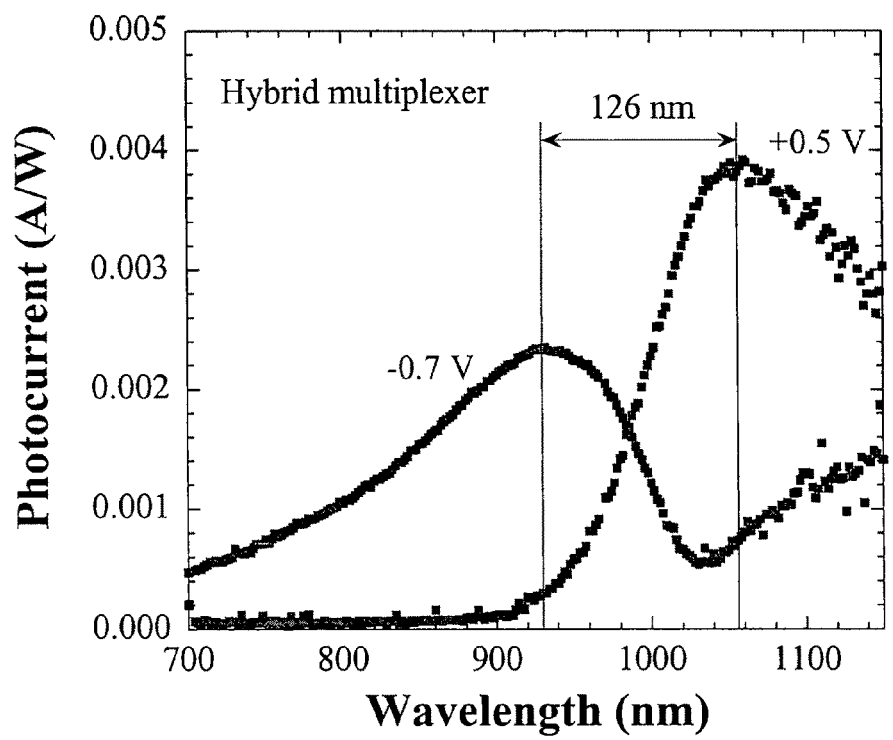
FIG. 15 is a graph demonstrating a hybrid multiplexer in accordance with one embodiment of the present invention by switching the responsivity of the p-GaAs/n-Si hetero-junction between the Si substrate and the thin-film GaAs.

FIGS. 14(a) and 14(b) show the PC spectra for various forward (+) and backward (−) biases. A considerable dependence on the bias is observed for both diodes. The measurements at 0.0 V are similar for both samples but considerable differences were observed for the reverse and forward biases. The p-GaAs/n-Si sample showed an increase in the responsivity in the vicinity of the GaAs bandgap for negative biases, whereas the PC at forward bias was governed by the absorption in the Si substrate. The responsivity of the n-GaAs/p-Si sample does not show such notable contributions of the GaAs film. This is a further indication that the GaAs film of the n-GaAs/p-Si is thinner than that of the p-GaAs/n-Si sample. Another reason for the unlikeness of the backwardly biased PC spectra is the quite different reverse current in both samples (see FIG. 13). The reverse current of the p-GaAs/n-Si sample is at least one order of magnitude below that of the counter sample. Therefore, at backward bias, the electric field over the pn-junction is larger in FIG. 14 (a) than in FIG. 14 (b). On the other hand, the fast growing forward current of the n-GaAs/p-Si causes the loss of responsivity already at modest positive biases. FIG. 15 shows the PC at +0.5 V and −0.7 V of the p-GaAs/n-Si sample. The "butterfly" shape of the spectra can be used to realize a hybrid multiplexer. If −0.7 V is applied solely light at 930 nm will result in the logic "1" at the output, and, in the other case, if +0.5 V is applied only light at 1056 nm switches the output to "1". It does not matter if the other wavelength hits the sample at the same time. Thus, the device converts two optical inputs into one electrical output, and thus may be applied in several memory, switching and logic devices.

Figure 16:
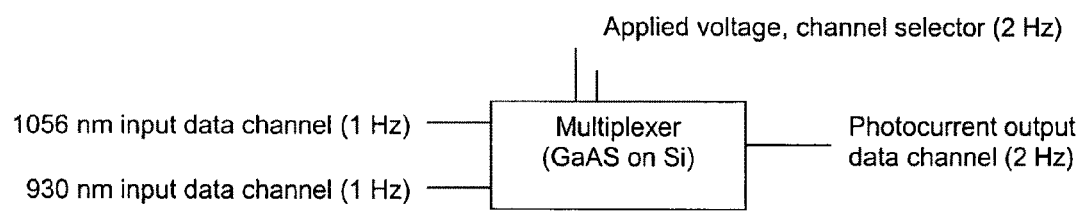
FIG. 16 is a schematic of a multiplexer that may be produced in accordance with one embodiment of the present invention.

FIG. 16 is a schematic of a multiplexer device showing an application of the articles manufactured in accordance with the invention. FIG. 5b shows the photocurrent of a p-GaAs/n-Si sample. The p-GaAs was deposited by means of pulsed laser deposition on an n-Si substrate. It turned out that the photocurrent of the sample is very sensitive to the polarity of the bias ("+" is forward and "−" is backward direction). In fact the hetero-pairing can be used as a multiplexer. For instance, if one applies −0.7 V only the 930 nm light will result in "1" at the output, and in the other case, if one applies +0.5 V only light at 1056 nm switches the output to "1". It does not matter if the other wavelength hits the sample. A truth table demonstrating how this device might be applied in a logic circuit is as follows:

| Input | | | |
|---|---|---|---|
| Applied Voltage | Incident Wavelength | | Logic Output |
| −0.7 V | 930 nm | 1056 nm | 1 |
| −0.7 V | dark | 1056 nm | 0 |
| +0.5 V | 930 nm | dark | 0 |
| +0.5 V | 930 nm | 1056 nm | 1 |

Accordingly, by employing PLD, the present invention allows for the successful deposition of polycrystalline thin-film GaAs on Si. The results show that photodiodes can be formed in a very straightforward way by depositing doped GaAs on counter doped Si, i.e., during PLD the doping of the target is sufficiently maintained in the deposited film in order to realize a pn-junction. Specifically, the p-GaAs/n-Si diode shows appealing bias dependent PC properties, which are of interest for hybrid multiplexing devices in telecommunications. The present invention also makes possible the use polycrystalline PLD GaAs as substrate provider for MBE-based industries.

With respect to an example of an experimental PLD setup used in accordance with the present invention, this is described herein and in Ref. 10 below. In order to determine whether highly absorbed laser pulses form different films than transmissive pulses we employed the emissions of a Nd:YAG laser (6 ns, 10 Hz) at 355 nm, 532 nm, and 1064 nm for the material ablation. The target was a 2-inch (100) p-type zinc doped GaAs wafer (1019 cm-3) and the material was ablated with a laser fluence of 0.79-0.84 J/cm2. The ambient pressure during the ablation process was kept at 10-6 Torr and the substrate, which was a 2-inch n-type phosphorous doped (100) Si wafer (≈1014 cm-3), was not heated. The ablation took place for one hour. At the fluence employed, the deposition rate at 1064 nm, 532 nm, and 355 nm is approximately 1 nm/min., 10 nm/min., and 5 nm/min., respectively, and the resulting film thickness for samples GaAs:1064, GaAs:532, and GaAs:355 is 60 nm, 600 nm, and 300 nm, respectively. The optical penetration depths were as follows: sample with 355 nm: 14 nm; sample with 532 nm: 130 nm; sample with 1064 nm: 1 mm. The optical penetration depth depends upon the adsorption of GaAs at the specific wavelength. The different penetration depths result in different affected volumes, energy densities and temperatures. Thus the ablation processes vary with these parameters.

Figure 17:
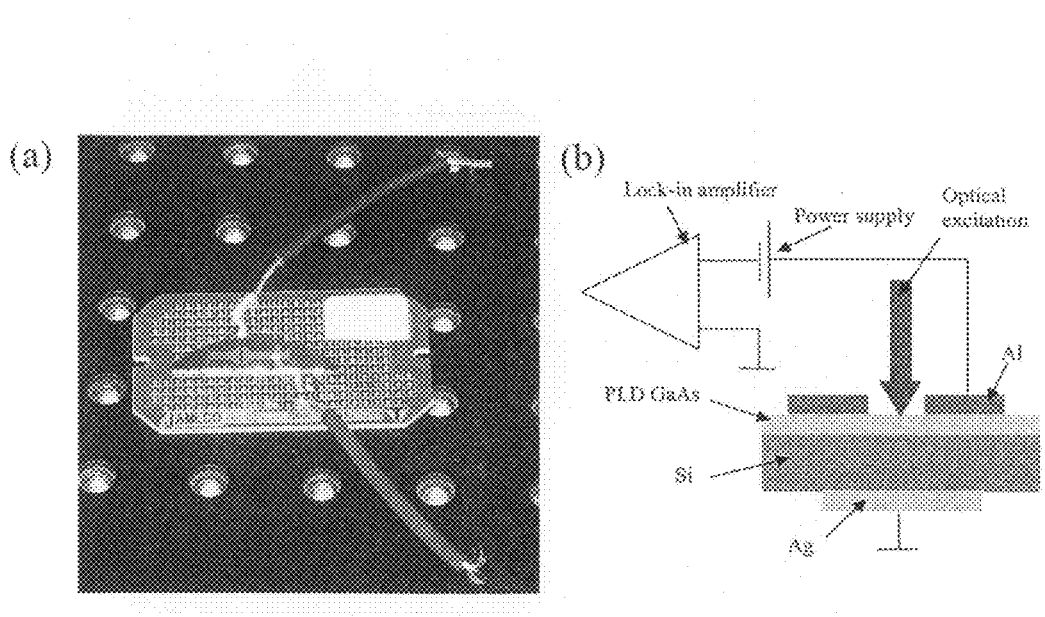
FIG. 17 is a combination of (a) photographic image of a p-GaAs/n-Si sample and (b) the schematic sketch of the circuit used to measure the photocurrent through a device in accordance with one embodiment of the present invention.

FIG. 17 shows a typical device structure and the schematic circuit used for the PC measurements including (a) an image of a p-GaAs/n-Si sample and (b) the schematic sketch of the circuit used to measure the PC. In order to measure the PC and current-voltage (I/V) characteristic across the junction, aluminum contacts have been evaporated on the GaAs film and the Si substrate was contacted with silver paste. The optical excitation, typically on the order of 1000 □W cm-2, was performed with a halogen lamp attached to a ½ m monochromator with a resolution of 0.5 nm. For the PC measurements, which have been carried out at room temperature, a lock-in amplifier and a programmable 100 V power supply have been employed. A high stability optical chopper provided the reference frequency (107 Hz) for the lock-in amplifier by chopping the light at the exit of the monochromator.

Figure 18:
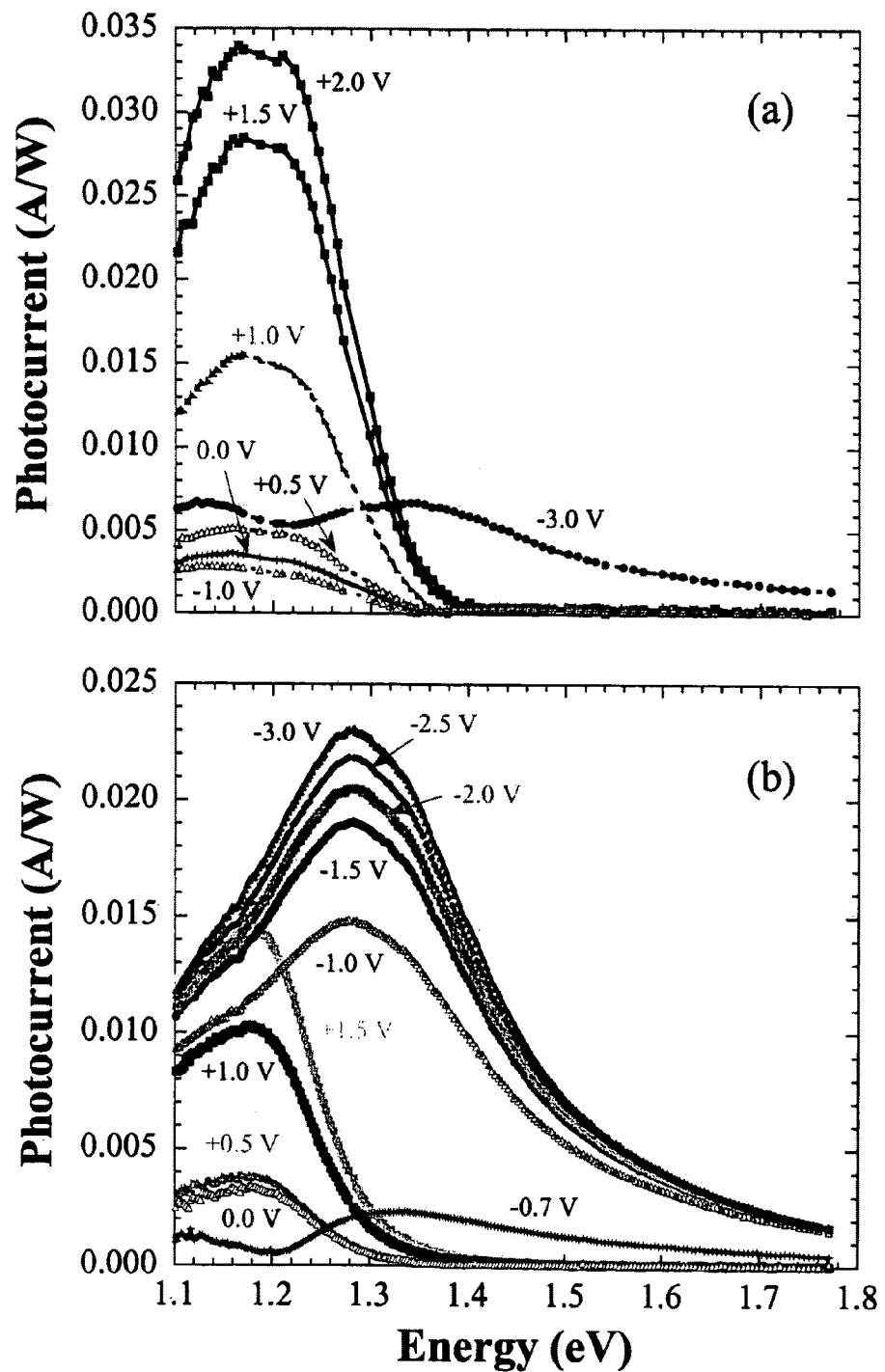
FIGS. 18(a) and 18(b) are respectively: (a) a graph of the photocurrent of the sample formed at 355 nm and (b) a graph of the photocurrent of the sample formed at 532 nm for various forward (+) and reverse biases; in accordance with one embodiment of the present invention.
Figure 19:
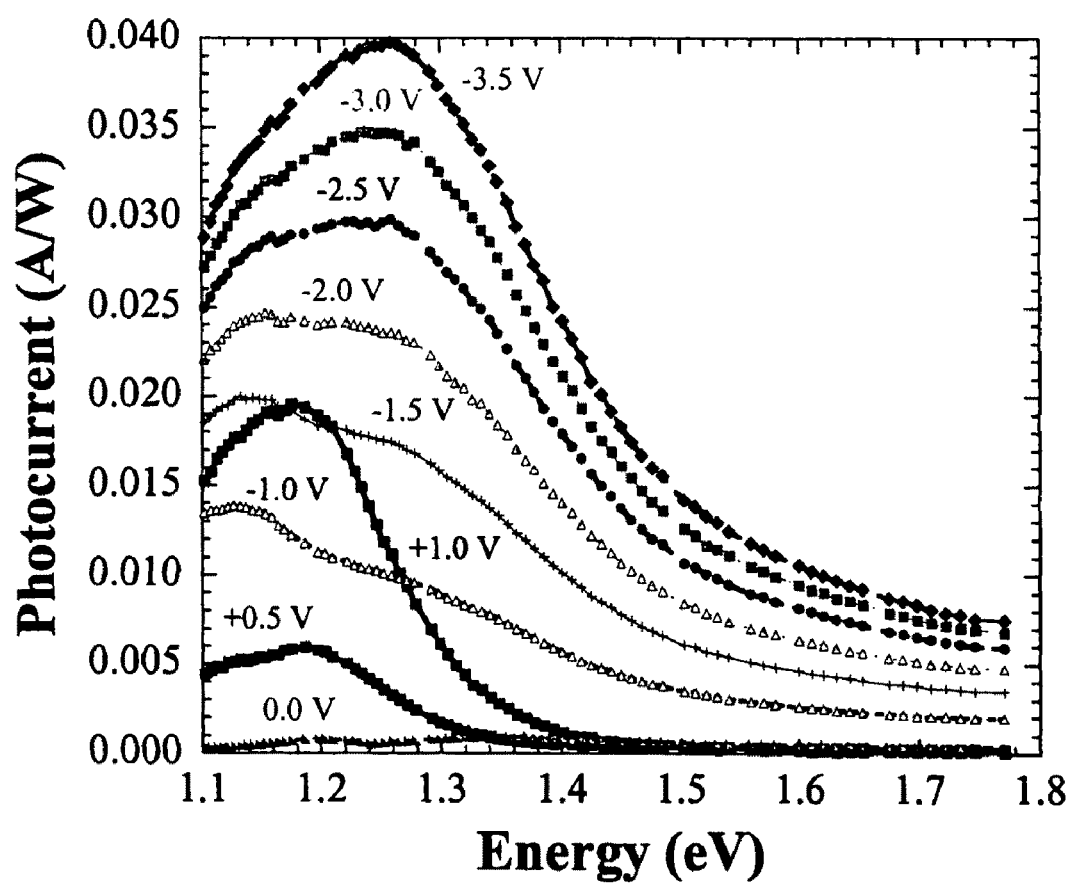
FIG. 19 is a graph of the photocurrent of the sample formed at 1064 nm, in accordance with one embodiment of the present invention.

FIGS. 18(a), 18(b), and 19 show the PC vs. energy for the samples formed at 355 nm, 532 nm and 1064 nm. The PC response is plotted for various forward (+) and reverse (−) biases. The data have been corrected with a calibrated Si photodiode and the results are shown in A/W.

Figures 20A, 20B:
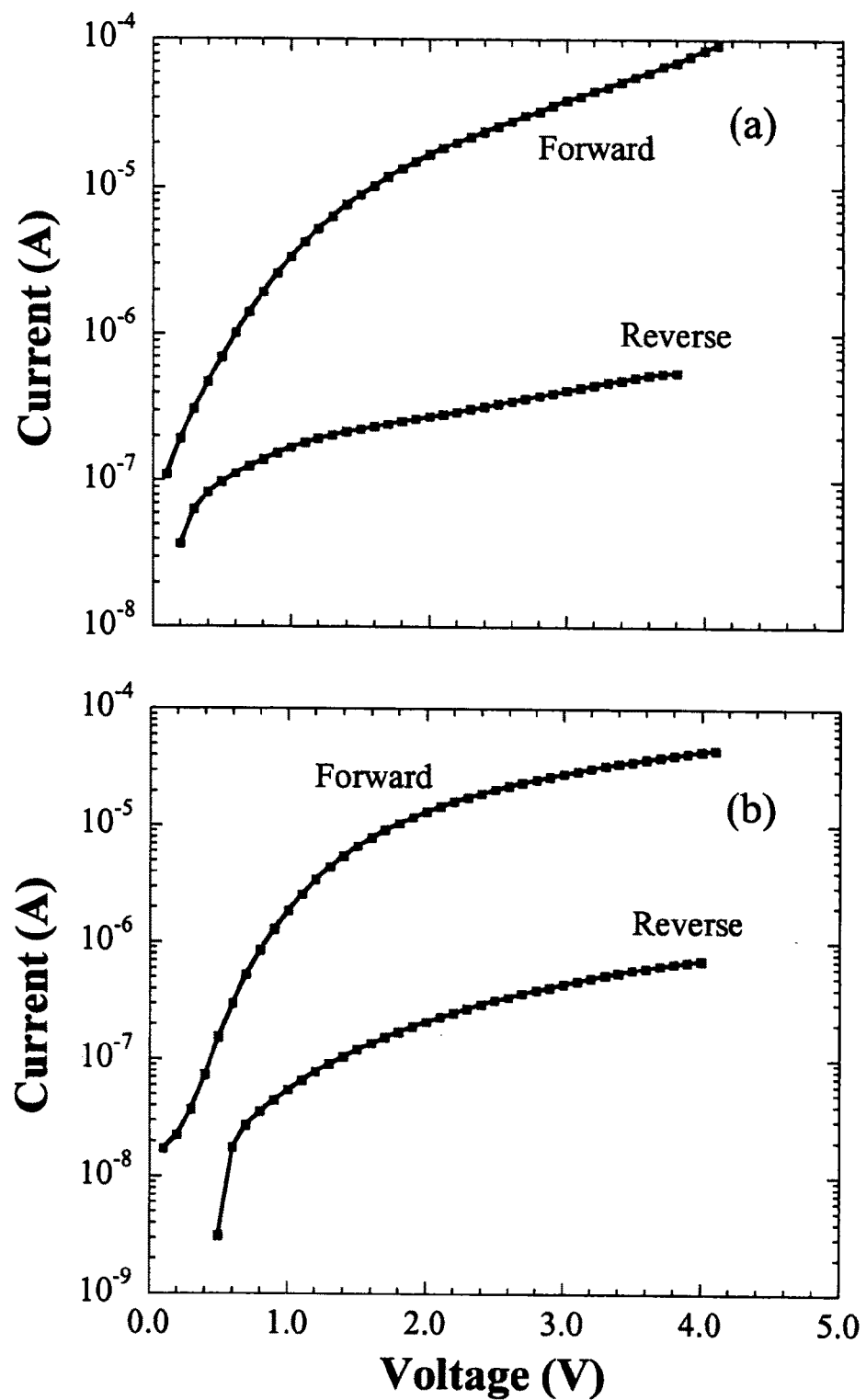
FIGS. 20(a) and 20(b) are respectively graphs of the I/V characteristic in the dark of the sample formed (a) at 355 nm and (b) at 532 nm, in accordance with one embodiment of the present invention.

The PC shows a considerable dependence on the bias for all three samples. The responses in FIGS. 18(a) and 18(b) appear to vary more at a first glance as they actually do: The measurements at 0.0 V, +0.5 V, +1.0 V, and +1.5 V are very similar for both samples. Differences have been observed when a reverse bias was applied. The responsivity is growing much faster with reverse bias in FIG. 18(b) than in FIG. 18(a). The divergence in the reversely biased responses is caused by differences in the I/V characteristics, which are plotted in FIGS. 20(a) and 20(b). At reverse biases up to −1.5 V, the sample GaAs:532 has a clearly lower reverse current than the sample GaAs:355. Hence, in comparison with FIG. 18(a), the electric field at the junction is larger in FIG. 18(b) and increases more effectively the built-in potential and moves the sensitivity peak of the photodiode towards higher energies. This explanation, however, is not sufficient because FIG. 21 reveals that sample GaAs:1064 has the highest reverse current of all samples but, nevertheless, delivers the largest A/W values under reverse bias, as it can be seen in FIG. 19. Thus, it appears that carrier trapping at the interface plays an important role for the formation of the PC.

Figure 21:
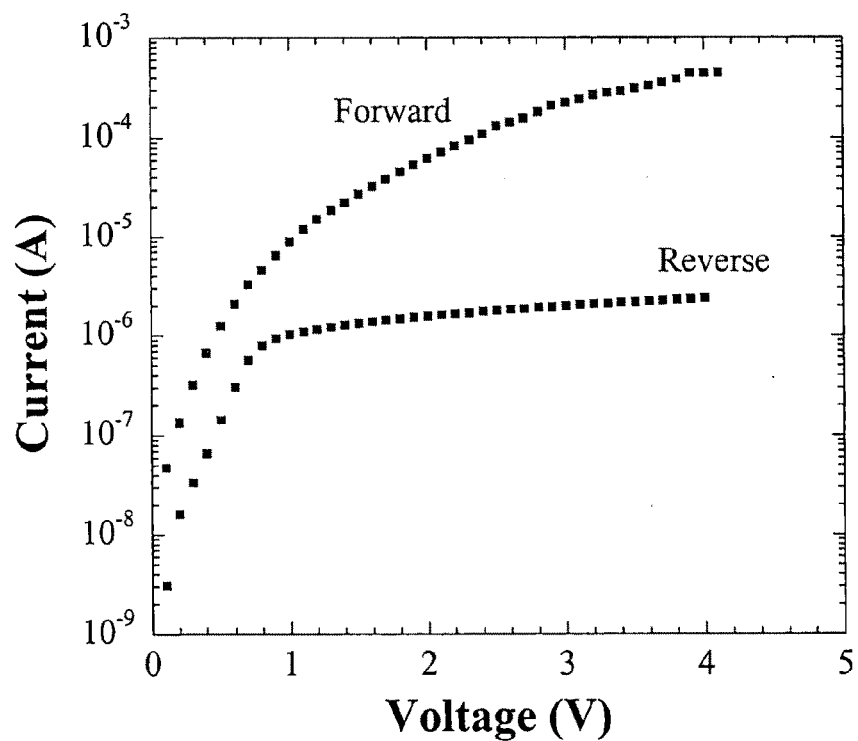
FIG. 21 is a graph of the I/V characteristic in the dark of the sample formed at 1064 nm.

It is worthwhile to stress at this point that the emissions at 355 nm and 532 nm are highly absorbed and transfer the material between target and substrate by ablation of a small surface segment of the target material. On the other hand, the infrared emission at 1064 nm is almost not absorbed and heats up a large volume in the target and the formation process of the GaAs films ought to be quite close to vacuum evaporation, as it was pointed out for thin-film PLD CdS.12 Consequently, it is fair to presume that the sample formed at 1064 nm exhibits a smoother interface, i.e., has less grain boundaries and rigid structures, than the samples formed with ablation. The smoother interface might favor the escape of excited photo-carriers via the contacts before interfacial recombination due to traps takes place, increasing the responsivity of the device. In forward direction, the situation is opposite. The samples GaAs:355 and GaAs:532 exhibit PC up to +2.0 V and +1.5 V (see FIGS. 18(a) and 18(b)), respectively, while the sample GaAs:1064 in FIG. 19 did not show PC at 1.5 V. The loss of responsivity is caused by the direct-current (DC) shortcut of the alternating-current (AC) signal in the sample. In FIG. 21, it is seen that at +2.0 V a current of almost 0.1 mA flew through the sample and almost all carriers are involved in the formation of the DC signal and the pn-junction loses its light sensitivity.[13]

Figures 22A, 22B:
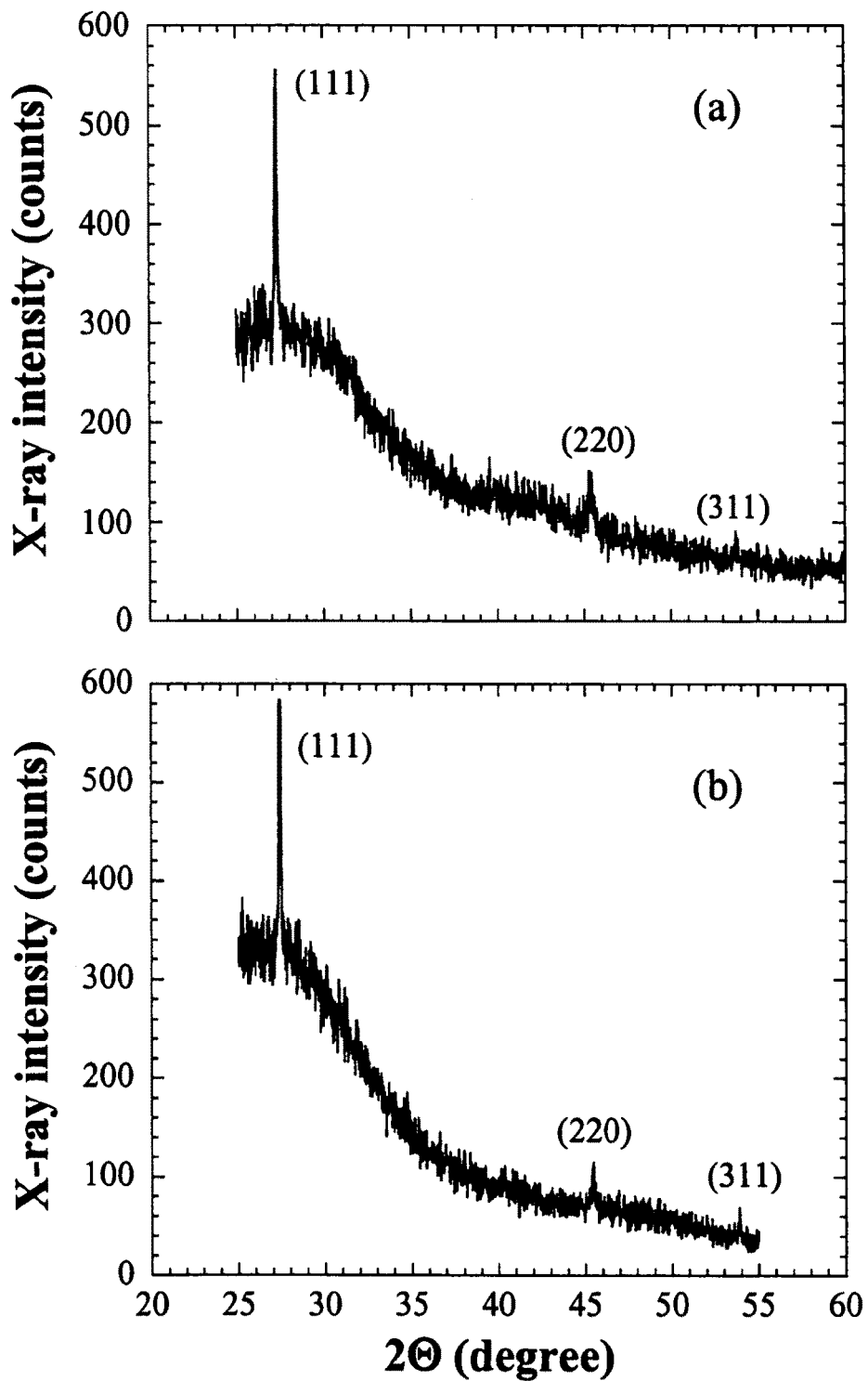
FIGS. 22(a) and 22(b) are respectively graphs of the X-ray patterns of the sample formed at (a) 355 nm and (b) 532 nm.
Figure 23:
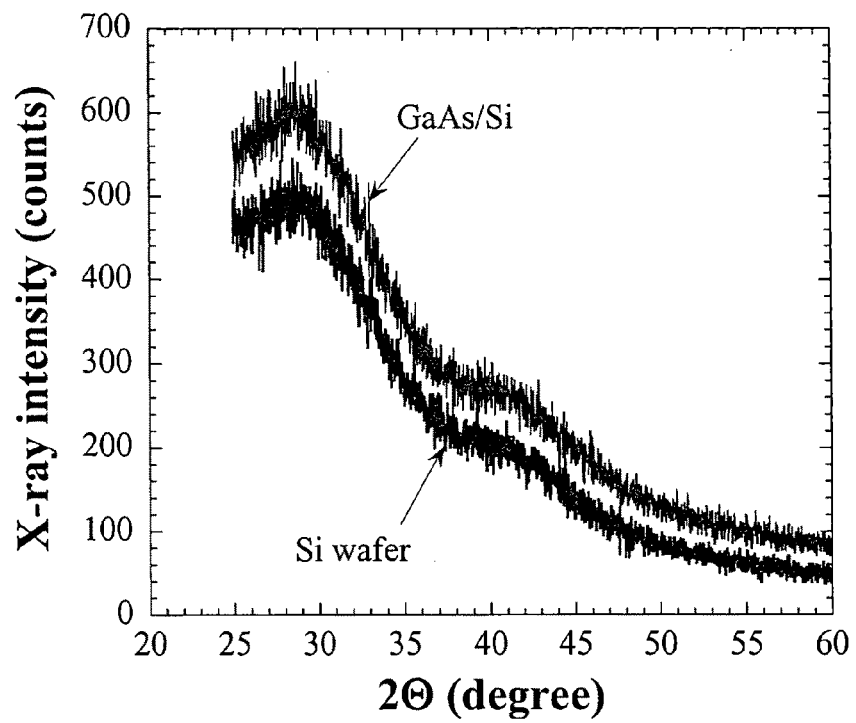
FIG. 23 is a graph of the X-ray signal of the film formed at 1064 nm and of a Si substrate without film.

FIGS. 22(a), 22(b) and 23 show the x-ray patterns of the GaAs:355, GaAs:532 and GaAs:1064 samples. The GaAs films show a preferred orientation towards the (111) plane. The Miller indices for each identified GaAs peak are indicated in the figures. For comparison, in FIG. 23, the x-ray signal of a Si substrate without thin-film GaAs is shown. The comparison reveals that the broad reflections are not an amorphous underground but are caused by the Si wafer. Hence, we deduce that the samples exhibit a polycrystalline structure or consist of crystallites embedded in an amorphous texture similar to the films deposited on glass. The results reveal that the quality of PLD GaAs does not depend on the substrate used, i.e., lattice match and crystallinity of the substrate are no issues for PLD and, additionally, PLD does not require substrate heating for the formation of polycrystalline GaAs. FIG. 23 shows that sample GaAs:1064 does not show patterns. This is not caused by the impossibility to form crystalline PLD GaAs at 1064 nm but by the circumstance that this film is considerable thinner than the others. Hence, no crystallites are yet formed and the material texture is amorphous. It is also possible that the cluster deposition at 355 nm and 532 nm enforces the build-up of crystalline islands faster than the atomic evaporation at 1064 nm.

Notably, the x-ray underground peak of the substrate is shifted to smaller angles for the samples GaAs:355 and GaAs:532 in comparison to sample GaAs:1064, which shows practically the identical x-ray spectrum as the Si wafer. Furthermore, it was observed that a broadening of the Si x-ray patterns for GaAs/Si samples formed at 532 nm. It is still subject of investigation but it seems that the clusters in the plume of highly absorbed laser pulses cause a transition of the Si crystal to a more amorphous structure. This observation appears to support the notion that the interface of the GaAs: 355 and GaAs:532 samples is of less quality than that of sample GaAs:1064. Thus, the trap formation appears not to be solely caused by difficulties during the GaAs deposition but also by lowering the crystal quality of the Si substrate.

The foregoing demonstrates that PLD is capable of the formation of polycrystalline thin-film GaAs on Si. We have achieved the results in the most straightforward manner without heating the substrate. The work stresses the capability of PLD to transfer the doping from the target to the deposited film: The rectifying features in conjunction with the bias dependent PC confirm that the doping of the target is maintained in the deposited thin-film GaAs, at least to a certain amount. We plan Hall measurements to clarify the exact doping concentration in the films. We also formed the counterpart of the investigated samples, i.e., n-GaAs/p-Si, which shows rectification and PC as well. The results illustrate that PLD is a fairly simple straightforward method, which facilitate the formation of competitive thin-film GaAs on Si for optoelectronic devices and substrate materials.

Additional background and information relating to the present invention is provided by the following references which are hereby incorporated by reference.

REFERENCES

1. M. S. Unlu, G. Munns, J. Chen, T. Won, H. Unlu, H. Morkoc, G. Radhakrishnan, J. Katz, and D. Verret, "Characteristics of annealed p/n junctions between GaAs and Si (100),"*Appl. Phys. Lett.* 51, pp. 1995-1997, 1987.
2. A. Georgakilas, P. Panayotatos, J. Stoemenos, J.-L. Mourrain, and A. Christou, "Achievements and limitations in optimized GaAs films grown on Si by molecular-beam epitaxy," *J. Appl. Phys.* 71, pp. 2679-2701, 1992.
3. V. Alberts, J. H. Neethling, and A. W. Leitch, "Correlation between structural, optical, and electrical properties of GaAs grown on (001) Si," *J. Appl. Phys.* 75, pp. 7258-7265, 1994.

4. J. Arokiaraj, T. Soga, T. Jimbo, and M. Umeno, "High-quality GaAs on Si substrate by epitaxial lift-off technique using SeS$_2$," *Appl. Phys. Lett.* 75, pp. 3826-3828, 1999.
5. D. S. Burgess, "Motorola grows GaAs on Silicon," Photonics Technology News October 2001.
6. N. Chandrasekaran, T. Soga, and T. Jimbo, "GaAs film on Si substrate transplanted from GaAs/Ge structure by direct bonding," *Appl. Phys. Lett.* 82, pp. 3892-3894, 2003.
7. D. L. Smith, *Thin-Film Deposition, Principles & Practice*, p. 394, MacGraw-Hill, Inc., New York, 1995.
8. V. S. Ban and D. A. Kramer, "Thin films of semiconductor and dielectrics produced by laser evaporation," *J. Mat. Sci.* 5, pp. 978-982, 1970.
9. D. B. Chrisey and G. K. Hubler (Eds.), *Pulsed Laser Deposition of Thin Films*, p. 260, John Wiley & Sons, New York, 1994.
10. B. Ullrich, A. Erlacher, S. Yano, R. Schroeder, T. G. Gerasimov, and H. J. Haugan, "Preparation of thin-film GaAs on glass by pulsed-laser deposition," in Proceedings of SPIE Vol. 4977 *Photon Processing in Microelectronics and Photonics II*, edited by Alberto Pique, Koji Sugioka, Peter R. Herman, Jim Fieret, Friedrich G. Bachmann, Jan J. Dubowski, Willem Hoving, Kunihiko Washio, David B. Geohegan, Frank Traeger, and Kouichi Murakami, (SPIE, Bellingham, Wash., 2003) 180-187.
11. A. Erlacher and B. Ullrich, "All-optical digitizing of laser transmission through thin-film GaAs on glass," *Semicond. Sci. Technol.* 19, pp. L9-L12, 2004.
12. B. Ullrich, H. Sakai, and Y. Segawa, "Optoelectronic properties of thin-film CdS formed by ultraviolet and infrared pulsed-laser deposition," Thin Solid Films 385, pp. 220-224, 2000.
13. B. Ullrich, N. M. Dushkina, H. Ezumi, S. Keitoku, and T. Kobayashi, "Dependence of the photocurrent on a bias of a p-InP/n-CdS heterojunction formed by laser ablation," Solid State Commun. 103, 635-637, 1997.
14. K. W. Eisenbeiser and J. Ramdani, "Structure and method for fabricating semiconductor structures and devices not lattice matched to the substrate," US Patent 20020030246, 2002.
15. J. Carlin, S. A. Ringel, E. A Fitzgerald, and M. Bulsara, "High Quality GaAs Growth by MBE on Si Using GeSe Buffers and Prospects for Space Voltaics," *Prog. Photovolt: Res. Appl.* 8, pp. 323-332, 2000.
16. B. Ullrich, A. Erlacher, S. Yano, R. Schroeder, T. G. Gerasimov, and H. J. Haugan, "Preparation of thin-film GaAs on glass by pulsed-laser deposition," in Proceedings of SPIE Vol. 4977 *Photon Processing in Microelectronics and Photonics II*, edited by Alberto Pique, Koji Sugioka, Peter R. Herman, Jim Fieret, Friedrich G. Bachmann, Jan J. Dubowski, Willem Hoving, Kunihiko Washio, David B. Geohegan, Frank Traeger, and Kouichi Murakami, (SPIE, Bellingham, Wash., 2003) 180-187.
5. D. L. Smith, *Thin-Film Deposition, Principles & Practice*, p. 394, MacGraw-Hill, Inc., New York, 1995.

The preferred methods, apparatus and devices of the present invention are described herein is not intended to be exhaustive or to limit the invention to the precise forms disclosed. They are chosen and described to explain the principles of the invention and the application of the method to practical uses so that others skilled in the art may practice the invention.

Having shown and described preferred embodiments of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A tunable photodiode comprising:
    (a) a diode structure comprising:
        (i) A first layer comprising silicon; and
        (ii) a second layer comprising gallium arsenide;
    said diode structure having an input and an output in contact therewith;
    said gallium arsenide of said second layer being layered onto said silicon of said first layer in a substantially stoichiometric ratio, and whereby said layer of gallium arsenide deposited upon said layer of silicon has a smoothness variation less than 100 nanometers; and
    (b) an adjustable source of electrical potential connected to said input and output contacts, whereby the peak wavelength sensitivity of said diode structure to incident light thereupon being tuned through application of said electrical potential.

2. A tunable photodiode according to claim 1 wherein said gallium arsenide is n-doped.

3. A tunable photodiode according to claim 1 wherein said gallium arsenide is p-doped.

4. A tunable photodiode according to claim 1 wherein said silicon is n-doped.

5. A tunable photodiode according to claim 1 wherein said silicon is p-doped.

6. A tunable photodiode according to claim 1 wherein said gallium arsenide is n-doped and wherein said silicon is p-doped.

7. A tunable photodiode according to claim 1 wherein said gallium arsenide is p-doped and wherein said silicon is n-doped.

8. A tunable photodiode according to claim 1 wherein said silicon and said gallium arsenide are non-doped.

* * * * *